(12) United States Patent
Takaki

(10) Patent No.: US 9,583,539 B2
(45) Date of Patent: Feb. 28, 2017

(54) WORD LINE CONNECTION FOR MEMORY DEVICE AND METHOD OF MAKING THEREOF

(71) Applicant: SanDisk 3D LLC, Milpitas, CA (US)

(72) Inventor: Seje Takaki, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 53 days.

(21) Appl. No.: 14/463,113

(22) Filed: Aug. 19, 2014

(65) Prior Publication Data

US 2016/0056210 A1 Feb. 25, 2016

(51) Int. Cl.
*H01L 27/24* (2006.01)
*H01L 21/768* (2006.01)
(Continued)

(52) U.S. Cl.
CPC .... *H01L 27/2481* (2013.01); *H01L 21/32139* (2013.01); *H01L 21/76892* (2013.01); *H01L 27/0688* (2013.01); *H01L 27/1157* (2013.01); *H01L 27/11573* (2013.01); *H01L 27/11575* (2013.01); *H01L 27/11582* (2013.01); *H01L 27/249* (2013.01); *H01L 27/2454* (2013.01); *H01L 45/1226* (2013.01);
(Continued)

(58) Field of Classification Search
CPC .......................... H01L 27/1157; H01L 27/2481
See application file for complete search history.

(56) References Cited

U.S. PATENT DOCUMENTS 5,915,167 A 6/1999 Leedy
7,005,350 B2 2/2006 Walker et al.
(Continued)

FOREIGN PATENT DOCUMENTS

EP 2136398 A1 12/2009
KR 10-2010-0109745 10/2010
(Continued)

OTHER PUBLICATIONS

Invitation to Pay Additional Search Fees issued in PCT Application No. PCT/US13/41410, mailed Sep. 9, 2013, (6 pp.).
(Continued)

*Primary Examiner* — Angel Roman
(74) *Attorney, Agent, or Firm* — The Marbury Law Group PLLC

(57) ABSTRACT

A three-dimensional monolithic memory device includes at least one device region and a plurality of contact regions each including a stack of an alternating plurality of conductive word line contact layers and insulating layers located over a substrate, where the stacks in the plurality of contact regions are separated from one another by an insulating material, and a bridge connector including a conductive material extending between a first conductive word line contact layer of a first stack in a first contact region and a second conductive word line contact layer of a second stack in a second contact region, where the first word line contact layer extends in a first contact level substantially parallel to a major surface of the substrate and the second word line contact layer extends in a second contact level substantially parallel to the major surface of the substrate that is different than the first level.

37 Claims, 18 Drawing Sheets

(51) Int. Cl.
*H01L 21/3213* (2006.01)
*H01L 27/115* (2006.01)
*H01L 27/06* (2006.01)
*H01L 45/00* (2006.01)

(52) U.S. Cl.
CPC .......... *H01L 45/141* (2013.01); *H01L 45/145* (2013.01); *H01L 45/149* (2013.01); *H01L 45/16* (2013.01)

(56) References Cited

U.S. PATENT DOCUMENTS

| | | | |
|---|---|---|---|
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |
| 7,846,782 | B2 | 12/2010 | Maxwell et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,932 | B2 | 5/2012 | Nguyen et al. |
| 8,187,936 | B2 | 5/2012 | Alsmeier et al. |
| 8,394,716 | B2 | 3/2013 | Hwang et al. |
| 8,427,859 | B2 | 4/2013 | Sandhu et al. |
| 8,520,425 | B2 | 8/2013 | Xiao et al. |
| 2003/0062574 | A1 | 4/2003 | Hsieh |
| 2007/0210338 | A1 | 9/2007 | Orlowski |
| 2007/0252201 | A1 | 11/2007 | Kito et al. |
| 2008/0175032 | A1 | 7/2008 | Tanaka et al. |
| 2009/0001344 | A1 | 1/2009 | Schricker et al. |
| 2009/0230449 | A1 | 9/2009 | Sakaguchi et al. |
| 2009/0230454 | A1* | 9/2009 | Pekny ............... H01L 27/11568 257/319 |
| 2010/0013049 | A1 | 1/2010 | Tanaka et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0177566 | A1* | 7/2010 | Kim ................... G11C 16/0483 365/185.17 |
| 2010/0181610 | A1 | 7/2010 | Kim et al. |
| 2010/0207195 | A1 | 8/2010 | Fukuzumi et al. |
| 2010/0254191 | A1 | 10/2010 | Son et al. |
| 2010/0320528 | A1 | 12/2010 | Jeong et al. |
| 2011/0031546 | A1 | 2/2011 | Uenaka et al. |
| 2011/0076819 | A1 | 3/2011 | Kim et al. |
| 2011/0092038 | A1 | 4/2011 | Choi et al. |
| 2011/0133606 | A1 | 6/2011 | Yoshida et al. |
| 2011/0169071 | A1 | 7/2011 | Uenaka |
| 2011/0204420 | A1 | 8/2011 | Kim et al. |
| 2011/0266606 | A1 | 11/2011 | Park et al. |
| 2011/0316072 | A1 | 12/2011 | Lee |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0147648 | A1 | 6/2012 | Scheuerlein |
| 2012/0208347 | A1* | 8/2012 | Hwang ............... H01L 27/1157 438/430 |
| 2012/0211823 | A1 | 8/2012 | Lim et al. |
| 2012/0257452 | A1* | 10/2012 | Kim ................... G11C 16/0483 365/185.11 |
| 2013/0089974 | A1* | 4/2013 | Lee ................... H01L 27/11556 438/510 |
| 2013/0130468 | A1* | 5/2013 | Higashitani ......... H01L 29/7926 438/382 |
| 2013/0264631 | A1 | 10/2013 | Alsmeier et al. |
| 2013/0313627 | A1 | 11/2013 | Lee et al. |
| 2016/0005758 | A1* | 1/2016 | Hu .................... H01L 27/1157 257/324 |

FOREIGN PATENT DOCUMENTS

| | | |
|---|---|---|
| KR | 10-2011-0021444 | 3/2011 |
| WO | WO02/15277 A2 | 2/2002 |

OTHER PUBLICATIONS

U.S. Appl. No. 14/133,979, filed Dec. 19, 2013, SanDisk Technologies Inc.
U.S. Appl. No. 14/136,103, filed Dec. 20, 2013, SanDisk Technologies Inc.
U.S. Appl. No. 14/468,644, filed Aug. 26, 2014, SanDisk Technologies Inc.
U.S. Appl. No. 14/468,744, filed Aug. 26, 2014, SanDisk Technologies Inc.
U.S. Appl. No. 14/224,290, filed Mar. 25, 2014, SanDisk Technologies Inc.
U.S. Appl. No. 14/150,162, filed Jan. 8, 2014, SanDisk Technologies Inc.
U.S. Appl. No. 14/206,196, filed Mar. 12, 2014, SanDisk Technologies Inc.
International Search Report & Written Opinion, PCT/US2011/042566, Jan. 17, 2012 (30 pp.).
Invitation to Pay Additional Fees & Partial International Search Report, PCT/US2011/042566, Sep. 28, 2011. (7 pp.).
Endoh, T. et al., titled "Novel Ultra High Density Memory With a Stacked-Surrounding Gate Transistor (S-SGT) Structured Cell", IEDM Proc. (2001) 33-36.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Kimura, Masahide "3D Cells Make Terabit NAND Flash Possible," Nikkei Electronics Asia, Sep. 17, 2009, 6pgs.
Maeda et al., "Multi-Stacked 1G Cell/Layer Pipe-Shaped BiCS Flash Memory," 2009 Symposium on VLSI Technology Digest of Technical Papers, pp. 22-23.
Tanaka et al., "Bit-Cost Scalable Technology for Low-Cost and Ultrahigh-Density Flash Memory," Toshiba Review, vol. 63, No. 2, 2008, pp. 28-31.
International Search Report for International Application No. PCT/US2015/043544, dated Oct. 21, 2015, 4 pages.
Written Opinion of the International Searching Authority for International Application No. PCT/US2015/043544, dated Oct. 21, 2015, 7 pages.

* cited by examiner

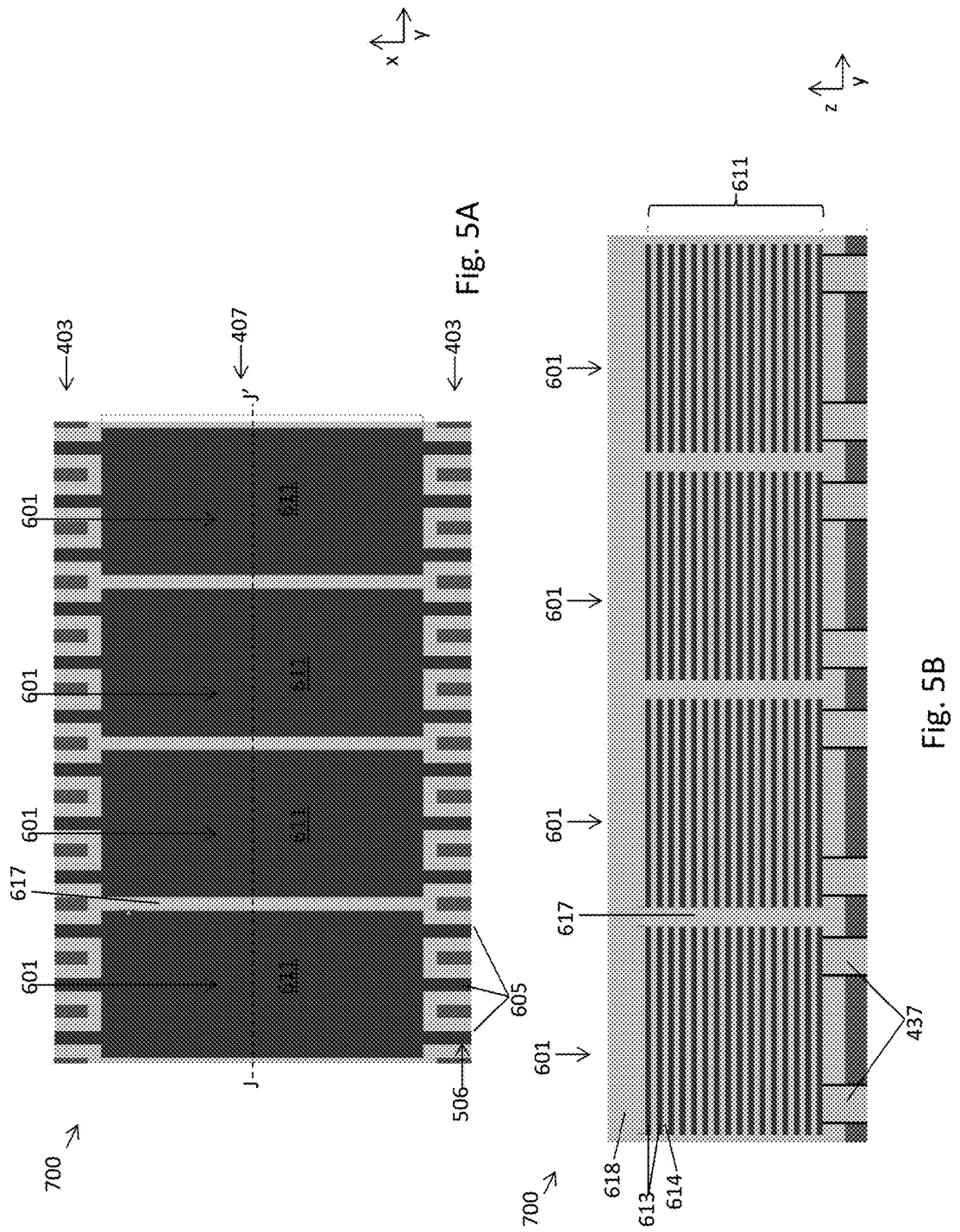

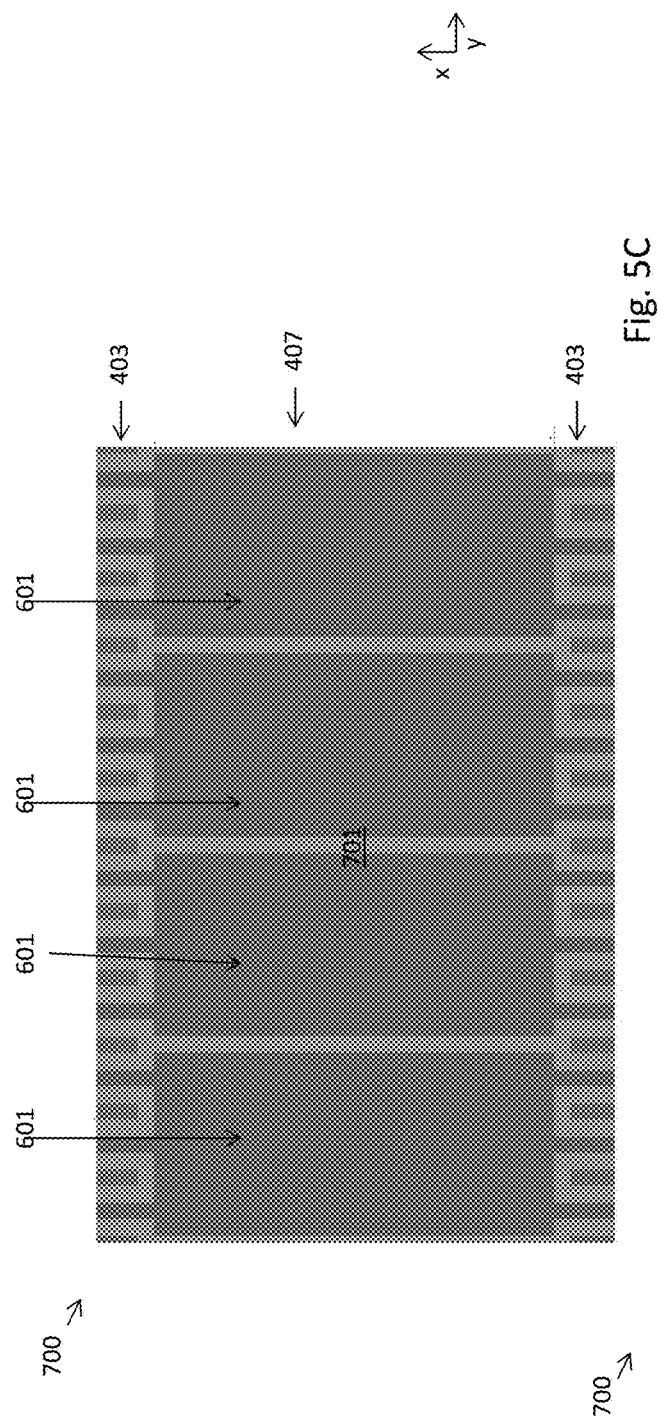
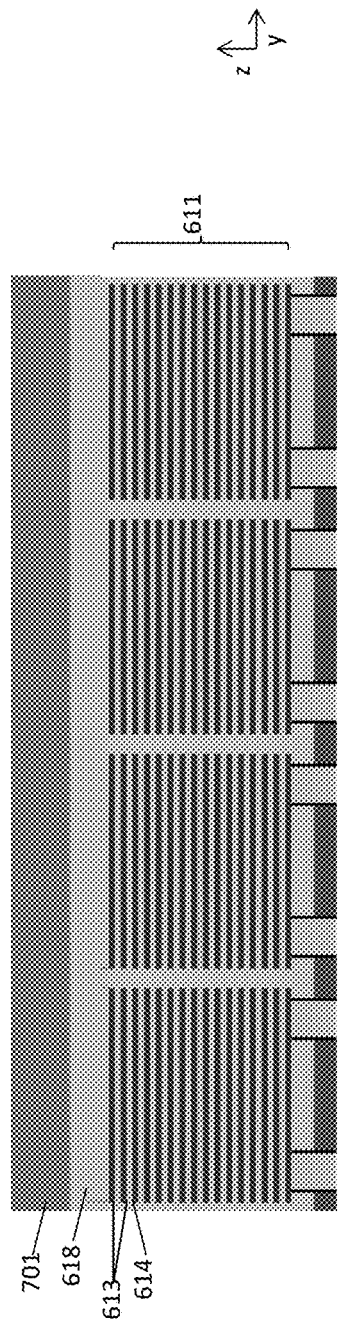
Fig. 5C
Fig. 5D

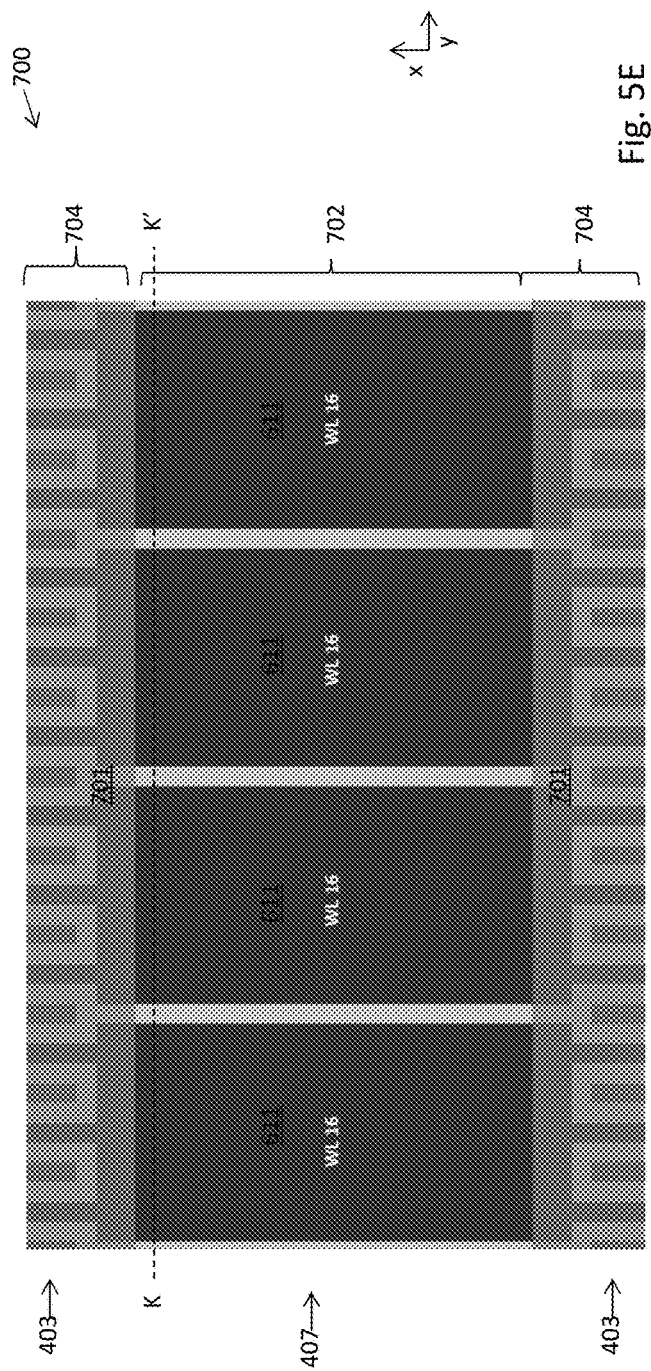
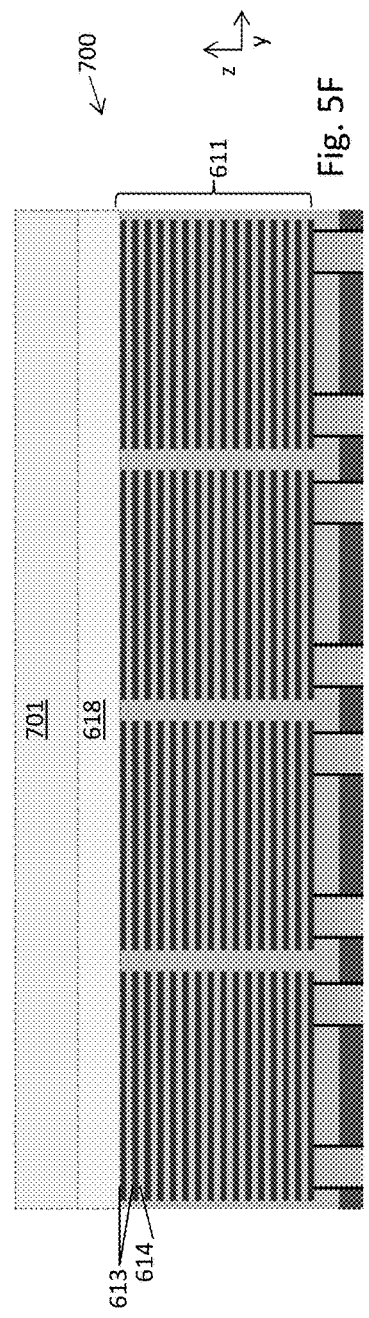
Fig. 5E
Fig. 5F

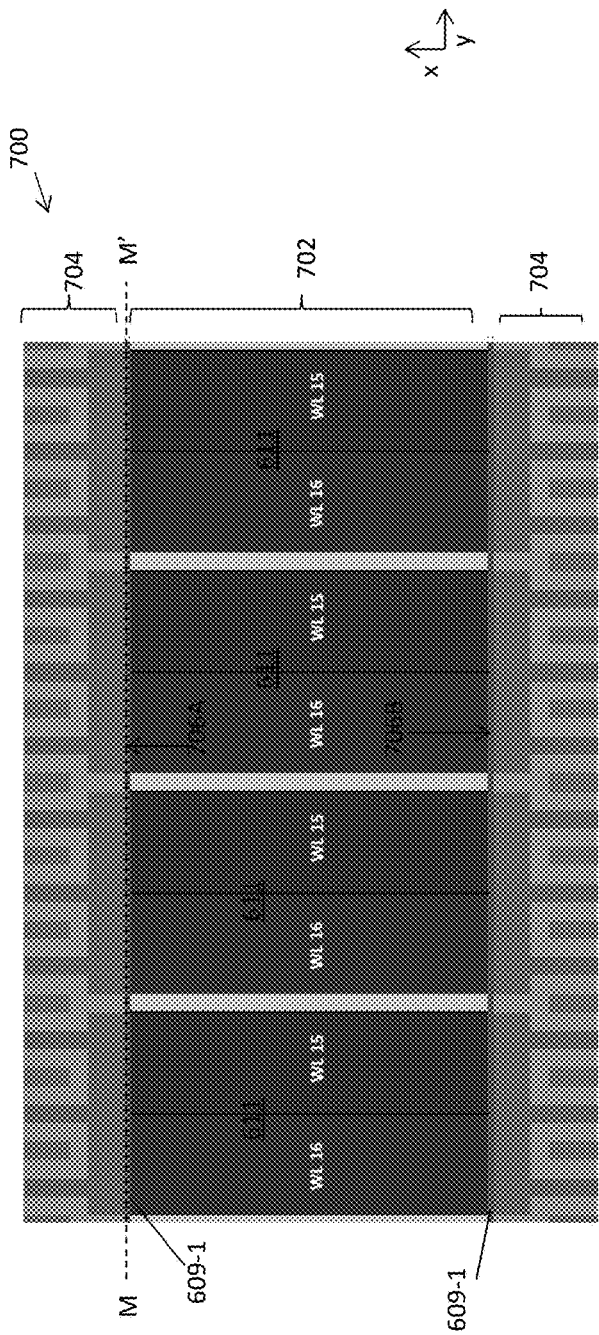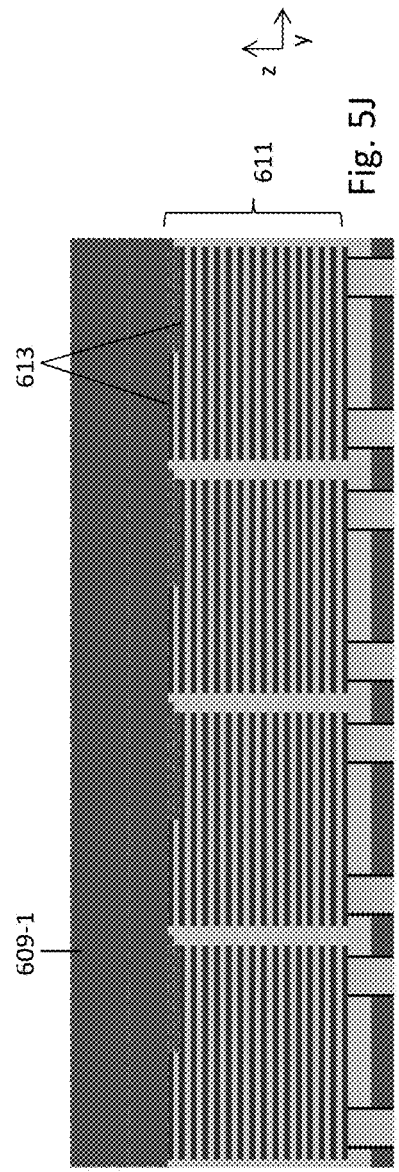

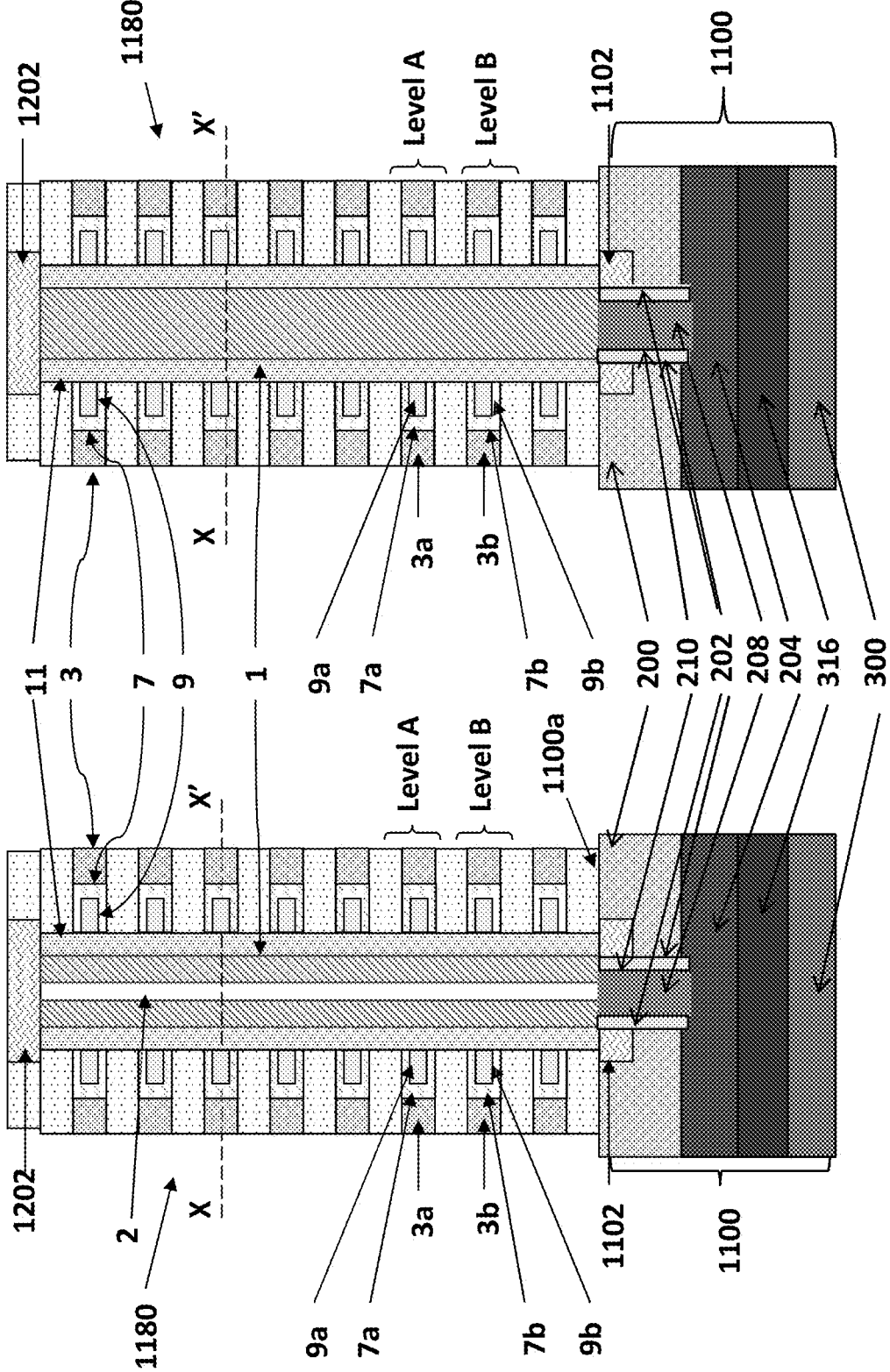

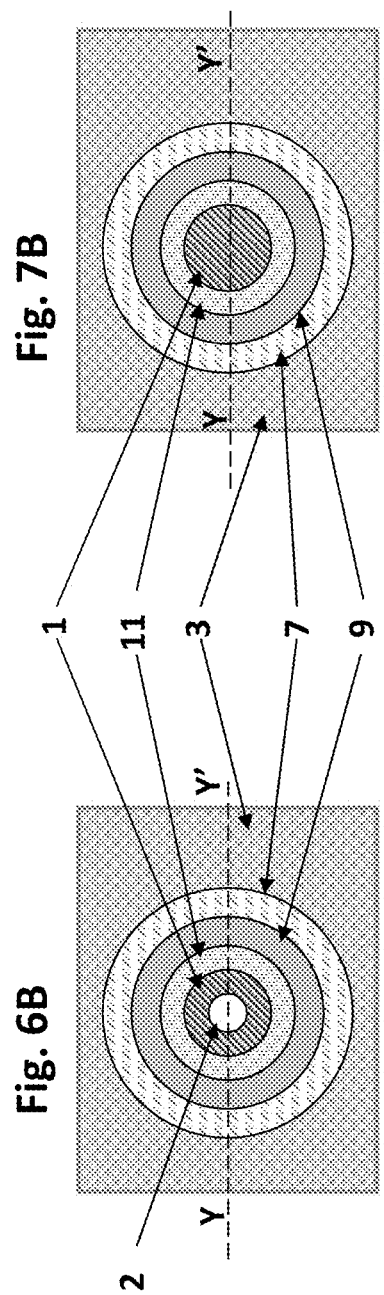

WORD LINE CONNECTION FOR MEMORY DEVICE AND METHOD OF MAKING THEREOF

FIELD

The present invention relates generally to the field of semiconductor devices and specifically to three-dimensional monolithic memory devices, such as vertical restive random access memory (ReRAM) devices and vertical NAND strings, and other three dimensional devices and methods of making thereof.

BACKGROUND

One example of non-volatile memory uses variable resistance memory elements that may be set to either low or high resistance states, and can remain in that state until subsequently re-set to the initial condition. The variable resistance memory elements are individually connected between two orthogonally extending conductors (typically bit and word lines) where they cross each other in a two-dimensional array. The state of such a memory element is typically changed by proper voltages being placed on the intersecting conductors. An example of an array of variable resistive elements and associated diodes is given in U.S. Patent Application Publication No. US 2009/0001344.

SUMMARY

One embodiment relates to a three-dimensional monolithic memory device including at least one device region and a plurality of contact regions each comprising a stack of an alternating plurality of electrically conductive word line contact layers and electrically insulating layers located over a substrate, wherein the stacks in the plurality of contact regions are separated from one another by an insulating material, and a bridge connector comprising an electrically conductive material extending between a first electrically conductive word line contact layer of a first stack in a first contact region and a second electrically conductive word line contact layer of a second stack in a second contact region, wherein the first electrically conductive word line contact layer extends in a first contact level substantially parallel to a major surface of the substrate and the second electrically conductive word line contact layer extends in a second contact level substantially parallel to the major surface of the substrate that is different than the first level.

Another embodiment relates to a method of making a three-dimensional monolithic memory device that includes providing an in-process multilevel device comprising at least one device region and a plurality of contact regions each comprising a stack of an alternating plurality of electrically conductive word line contact layers and electrically insulating layers located over a substrate, wherein the stacks in the plurality of contact regions are separated from one another by an insulating material, and forming a bridge connector comprising an electrically conductive material extending between a first electrically conductive word line contact layer of a first stack in a first contact region and a second electrically conductive word line contact layer of a second stack in a second contact region, wherein the first electrically conductive word line contact layer extends in a first contact level substantially parallel to a major surface of the substrate and the second electrically conductive word line layer extends in a second contact level substantially parallel to the major surface of the substrate that is different than the first contact level.

Another embodiment relates to a three-dimensional monolithic memory device including a plurality of word line select transistors, a word line connection area located above the plurality of word line select transistors, a second plurality of select transistors located in a same level of the device as the word line select transistors, and a three-dimensional memory array comprising a plurality of memory cells located above the second plurality of select transistors.

Another embodiment relates to a method of making a three-dimensional monolithic memory device that includes forming a plurality of word line select transistors in a first region of the device, forming a second plurality of select transistors in a second region of the device adjacent to the first region, and the second plurality of select transistors are formed in a same level of the device as the word line select transistors, forming a word line connection area in the first region above the plurality of word line select transistors, and forming a three-dimensional memory array comprising a plurality of memory cells in the second region above the second plurality of select transistors.

BRIEF DESCRIPTION OF THE DRAWINGS

FIGS. 6A-6B are respectively side cross sectional and top cross sectional views of a NAND string of one embodiment. FIG. 6A is a side cross sectional view of the device along line Y-Y' in FIG. 6B, while FIG. 6B is a side cross sectional view of the device along line X-X' in FIG. 6A.

FIG. 7A-7B are respectively side cross sectional and top cross sectional views of a NAND string of another embodiment. FIG. 7A is a side cross sectional view of the device along line Y-Y' in FIG. 7B, while FIG. 7B is a side cross sectional view of the device along line X-X' in FIG. 7A.

DETAILED DESCRIPTION

Embodiments of the present invention will be described below with reference to the accompanying drawings. It should be understood that the following description is intended to describe exemplary embodiments of the invention, and not to limit the invention.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Embodiments of the invention provide a monolithic, three dimensional arrays of memory devices, such as an array of ReRAM devices or vertical NAND strings. The memory cells of such devices may be vertically oriented, such that at least one memory cell is located over another memory cell. The array allows vertical scaling of the devices to provide a higher density of memory cells per unit area of silicon or other semiconductor material.

Figure 1:
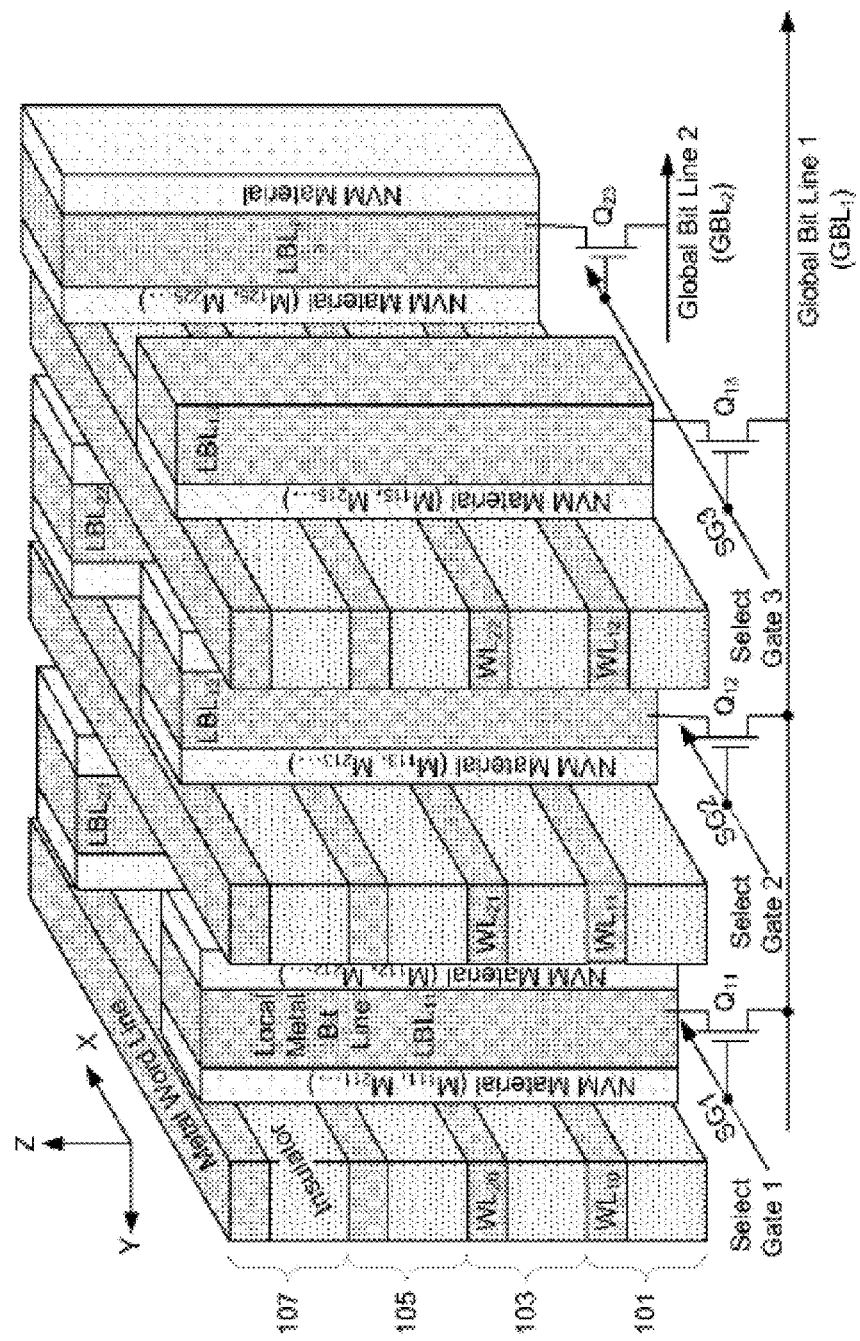
FIG. 1 shows a perspective view of a three dimensional ReRAM memory device.

FIG. 1 shows one example semiconductor structure for implementing a vertically oriented 3D ReRAM memory element, of the type described in U.S. Pat. Pub. No. 2012/0147648, published Jun. 14, 2012 and incorporated by reference herein in its entirety. The ReRAM device is configured for use of non-volatile memory element ("NVM") material that is non-conductive when first deposited. Since the material is initially non-conductive, there is no necessity to isolate the memory elements at the crosspoints of the word and bit lines from each other. Several memory elements may be implemented by a single continuous layer of material, which in the case of FIG. 1 are strips of NVM material oriented vertically along opposite sides of the vertical bit lines in the y-direction and extending upwards through all the planes in the z-direction. A significant advantage of the structure of FIG. 1 is that all word lines and strips of insulation under them in a group of planes may be defined simultaneously by use of a single mask, thus greatly simplifying the manufacturing process.

Referring to FIG. 1, a small part of four planes (e.g., device levels separated in the z-direction) 101, 103, 105 and 107 of the three-dimensional array are shown. All of the planes have the same horizontal pattern of conductive, insulating and NVM materials. In each plane, electrically conductive (e.g., metal) word lines ($WL_{zy}$) are elongated in the x-direction and spaced apart in the y-direction. Each plane includes a layer of insulating material (e.g., a dielectric) that isolates its word lines from the word lines of the plane below it or, in the case of plane 101, of the substrate circuit components below it. In some embodiments, the word lines $WL_{zy}$ for a fixed value of y form a stack of alternating layers that may extend beyond the memory device into a contact area (not shown).

Extending through each plane is a collection of electrically conductive (e.g., metal) local bit line (LBL) "pillars" elongated in the vertical z-direction and forming a regular array in the x-y planes.

Each bit line pillar is connected to one of a set of underlying global bit lines (GBL) (e.g., located in or over the silicon substrate) running in the y-direction at the same pitch as the pillar spacing through the select devices ($Q_{xy}$) which may also be formed in or over the substrate whose gates are driven by the row select lines (SG) elongated in the x-direction, which may also be formed in or over the substrate. The select devices $Q_{xy}$ may be vertically oriented field effect transistors. Examples of suitable transistors for the select devices $Q_{xy}$ are described, for example, in U.S. patent application Ser. No. 14/206,196, filed Mar. 12, 2014, which is incorporated by reference herein in its entirety. Also fabricated in the substrate but not shown in FIG. 1 are sense amplifiers, input-output (I/O) circuitry, control circuitry, and any other necessary peripheral circuitry. There is one row select line (SG) for each row of local bit line pillars in the x-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element/memory cell (M) is located at each intersection of a word line (WL) and a local bit line (LBL). In the case of a metal oxide (e.g., nickel oxide or copper oxide) for the memory storage element material, a small region of the NVM material between an intersecting local bit line (LBL) and word line (WL) is controllably alternated between more conductive (set) and less conductive (reset) states by appropriate voltages applied to the intersecting lines.

The material used for the non-volatile memory elements $M_{zxy}$ in the array of FIG. 1 can be a metal oxide, a carbon material, a chalcogenide, or any one of a number of materials that exhibit a stable, reversible shift in resistance in response to an external voltage applied to or current passed through the material.

One challenge for a three-dimensional memory device, such as the ReRAM device shown in FIG. 1, is providing the appropriate electrical connections to each of the word lines (WL) of the memory array. Typically, each word line in a column of memory elements (M) is connected to a different word line driver (e.g., word line select transistor) which enables the word lines of a column of memory elements to be individually selected (i.e., energized). The word line drivers may include complementary metal-oxide-semiconductor (CMOS) transistors located on the silicon substrate. A potential drawback to this approach is that it requires a relatively large area on the silicon substrate for the CMOS word line driver transistors which takes up space on the device and can increase chip size. However, alternative word line connection approaches may also be problematic by being very complicated and costly to fabricate, may present thermal budget issues and may also negatively influence ReRAM material performance.

Various embodiments relate to a three-dimensional monolithic memory device that includes at least one device region and a plurality of contact regions. Each of the contact regions may include a stack of an alternating plurality of word line contact layers and electrically insulating layers over a substrate, and the stacks in the plurality of contact regions may be separated from one another by an insulating material. The device further includes one or more bridge connectors, wherein each bridge connector comprises an electrically conductive material extending between a first electrically conductive word line contact layer of a first stack in a first contact region and a second electrically conductive word line contact layer of a second stack in a second contact region. The first word line contact layer extends in a first contact level substantially parallel to the major surface of the substrate, and the second word line contact layer extends in a second contact level substantially parallel to the major surface of the substrate that is different from the first level.

In embodiments, a plurality of bridge connectors may connect the respective word line contact layers of the first stack in the first contact region to the respective word line contact layers of the second stack in the second contact region. Each bridge connector may connect word line contact layers that extend in different contact levels. In embodiments, the word line contact layers of the stacks in each contact region may form a stepped pattern, such that each word line contact layer includes at least one contact portion that extends beyond at least one overlying layer of the stack (e.g., the overlying layer(s) of the stack may be etched to expose the at least one contact portion). Each of the bridge connectors may connect to a contact portion of a word line contact layer of the first stack in the first contact region to a contact portion of a word line contact layer of the second stack in the second contact region, where the word line contact layers of the first and second stacks extend in different contact levels. Each bridge connector may extend in a plane substantially perpendicular to the major surface of the substrate, and adjacent bridge connectors may be separated by sidewall spacers comprising an electrically insulating material.

In embodiments, a plurality of contact regions may be connected by bridge connectors in a "staircase" configuration. For example, a first set of bridge connecters may connect word line contact layers in relatively lower contact levels in a first contact region to word line contact layers in relatively higher contact levels in a second contact region. A second set of bridge connectors may connect the word line contact layers in the second contact region to word line contact layers in relatively higher contact levels in a third contact region, and so on. Thus, the bridge connectors may electrically connect each word line contact layer of a contact region with a plurality of contact layers in different contact regions, where each of the word line contact layers in the different contact regions is in a different (i.e., relatively higher or lower) contact level. The plurality of word line contact layers may be connected by the bridge connectors in a "staircase" configuration, from a lowest contact level (e.g., closest to the substrate) to a highest contact level (e.g., distal to the substrate).

Each of the word line contact layers may be electrically continuous with one or more electrically conductive word lines that extend into the device region at the same level as the respective word line contact layer. Each contact region may be located over one or more word line select transistors that are electrically connected to a first word line contact layer of the stack in the respective contact region. Thus, the word line select transistor may select (i.e., energize) a first set of one or more word lines that are electrically continuous with a first word line contact layer of the contact region that is located over the word line select transistor as well as additional sets of one or more word lines that are each continuous with word line contact layers of additional contact regions that are electrically connected to the first word line contact layer by one or more bridge connectors, wherein the first set of word lines and the additional sets of word lines each extend in different contact levels over the major surface of the substrate.

In embodiments, the three-dimensional monolithic memory device may include a plurality of word line select transistors, and the plurality of contact areas may be located in a word line connection area located above the plurality of word line select transistors. A second plurality of select transistors (e.g., bit line select transistors) may be located in a same level of the device as the word line select transistors. The device region, which may include a three-dimensional memory array comprising a plurality of memory cells, may be located above the second plurality of select transistors (e.g., such that each bit line select transistor may be electrically coupled to a vertical bit line of the memory array).

In embodiments, the plurality of word line select transistors and the second plurality of select transistors (e.g., bit line select transistors) may comprise the same type of transistor, such as field-effect thin-film transistors. Further, because the transistors are formed in the same level of the device, all of the select transistors (e.g., bit line and word line select transistors) of the device may be formed using the same process steps at substantially the same time. Thus, the additional process steps and thermal budget required to form the word line driver TFTs above the active memory cell region may be avoided.

In addition, as discussed above various embodiments may include a word line connection area located above the word line select transistors that may include discrete word line contact regions having a stepped or terraced pattern with bridge connectors connecting the word line contact layers at different contact levels in a "staircase" configuration, which may be less complex and less costly than alternative schemes for word line connections. In addition, the word line connection area of the embodiments of the invention may be relatively small and compact. In addition, because the word line select transistors may be formed at the same device level and using the same processes as the bit line select transistors, CMOS word line drivers on the device substrate may be avoided, which may conserve valuable chip space.

Figure 2:
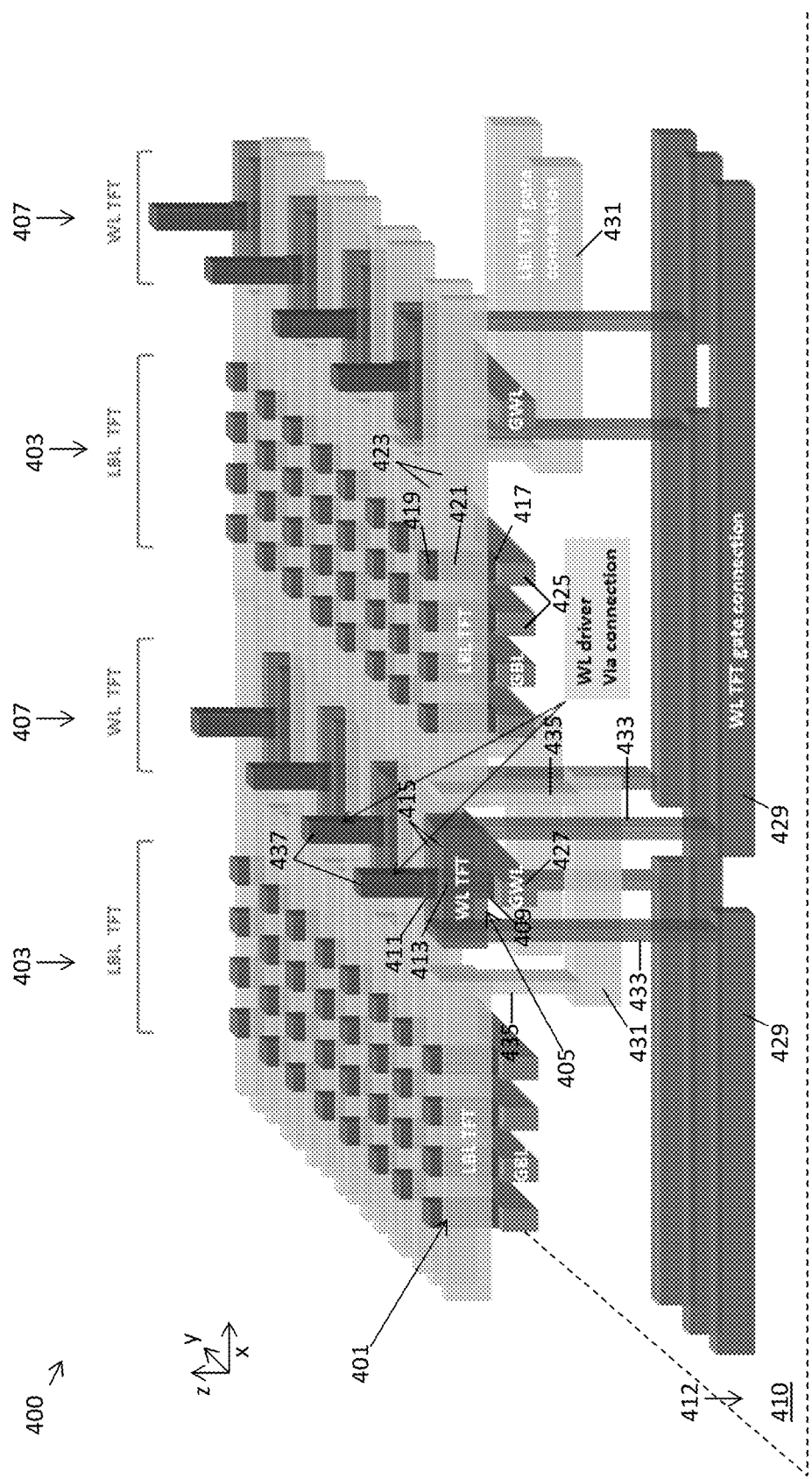
FIG. 2 shows a perspective view of word line select transistors and bit line select transistors formed in the same level of a three-dimensional monolithic memory device according to an embodiment.

FIG. 2 shows a perspective view of word line select transistors and bit line select transistors formed in the same level of a three-dimensional monolithic memory device 400 according to an embodiment. The bit line select transistors 401 are located in device regions 403 over a major surface 412 of a substrate 410 (schematically illustrated by dotted lines in FIG. 2). The word line select transistors 405 are located in word line connection regions 407 that extend along a first direction (i.e., the y-axis direction in FIG. 2) substantially parallel to the major surface 412 of the substrate 410 and located between adjacent device regions 403 along a second direction (i.e., the x-axis direction in FIG. 2) substantially parallel to the major surface 412 of the substrate 410.

Each of the word line select transistors 405 may comprise a vertically-oriented field effect transistor having a drain 409 comprising a first conductivity type (i.e., n-type or p-type) semiconductor region, a source 411 comprising the first conductivity type semiconductor region located above the drain 409, and a channel 413 comprising a second semiconductor type semiconductor region different from the first conductivity type (i.e., p-type or n-type). The channel 413 may extend substantially perpendicular to the major surface 412 of the substrate 410 between the drain 409 and the source 411. At least one gate 415 comprising an electrically conductive material (e.g., a heavily doped semiconductor material) is located adjacent to the channel 413 and is separated from the channel by a gate insulating material (e.g., an oxide material, not shown in FIG. 2). In the embodiment of FIG. 2, electrically conductive gates 415 are located adjacent to two sides of the channel 413.

Each of the bit line select transistors 401 may also comprise a vertically-oriented field effect transistor having a drain 417 and source 419 comprising first conductivity type semiconductor regions and a semiconductor channel 421 of a second conductivity type different from the first conductivity type extending substantially perpendicular to the major surface 412 of the substrate 410 between the drain 417 and source 419. At least one gate 423 comprising an electrically conductive material (e.g., a heavily doped semiconductor material) is located adjacent to the channel 421 and is separated from the channel by a gate insulating material (e.g., an oxide material, not shown in FIG. 2). In the embodiment of FIG. 2, electrically conductive gates 423 are located adjacent to two sides of each channel 421 Each of the gates 423 is elongated in the x-direction and extends in the device region 403 adjacent to a plurality of channels 421 of a row of bit line select transistors 401.

A set of underlying drain contact lines 425 (also referred to as global bit lines (GBLs)) extend in the device region 403 in the y-direction and at the same pitch as the spacing of the bit line select transistors 401 in the x-direction. The drain contact lines 425 may comprise an electrically conductive material and are electrically connected to the drain regions 417 of the bit line select transistors 401.

As also shown in FIG. 2, at least one elongated drain contact line 427 (i.e., a global word line (GWL)) comprising an electrically conductive material extends in the word line connection region 407 in the y-direction (i.e., parallel to the global bit lines (GBL) 425 and perpendicular to the direction of the gates 415 of the word line select transistors 405). The drain contact lines 427 may be electrically connected to the drain regions 409 of the word line select transistors 405. Each of the word line select transistors 405 within a word line connection region 407 may share a common drain contact line/global word line 427, as shown in FIG. 2.

In embodiments, the bit line select transistors 401 and the word line select transistors 403, including the respective gates 423, 415 and drain contact lines 425, 427, may comprise the same materials as each other and may be formed at the same time using substantially identical process steps (e.g., using thin film transistor processing techniques, such as the same photolithographic masks and the same layers that are etched after photolithography). In other embodiments, the respective transistors 401, 403 may comprise different materials and/or may be formed at separate times using different process steps. Suitable methods for thin film transistor (TFT) select devices for a three-dimensional memory array are described in U.S. patent application Ser. No. 14/206,196, filed Mar. 12, 2014, which was previously incorporated by reference herein in its entirety. The thin film transistors 405 in adjacent regions 407 may be offset from each other in the y-direction, as shown in FIG. 2.

Also shown in FIG. 2 is a first plurality of electrically conductive gate connection lines 429 that extend in the x-direction in at least the device region 403 and below the plurality of bit line select transistors 401. The first plurality of gate connection lines 429 may have the same pitch as the spacing (including the offset) of the word line select transistors 405 in the y-direction. A second plurality of electrically conductive gate connection lines 431 may extend in the word line connection region 407 in the x-direction and below the plurality of word line select transistors 405. The second plurality of gate connection lines 431 may have the same pitch as the spacing of the bit line select transistors 401 in the y-direction.

The first plurality of gate connection lines 429 and the second plurality of gate connection lines 431 may be located at different levels of the device. For example, as shown in FIG. 2, the first plurality of gate connection lines 429 may be formed on or over the major surface 412 of the substrate 410, and the second plurality of gate connection lines 431 may be formed over the major surface 412 of the substrate 410 at a level that is above the level of the first plurality of gate connection lines 429. An insulating fill material (not shown in FIG. 2 for clarity) may be located between the first plurality of gate connection lines 429 and the second plurality of gate connection lines 431, and between the second plurality of gate connection lines 431 and the respective bit line and word line select transistors 401, 405. A first plurality of conductive vias 433 (i.e., openings formed in the insulating fill material and filled with a metal or other electrically conductive material) may extend substantially perpendicular to the major surface 412 of the substrate 410 (i.e., in the z-direction in FIG. 2) to connect the ends of each of the gates 415 of the word line select transistors 405 to one of the first plurality of gate connection lines 429. Similarly, a second plurality of conductive vias 435 may extend substantially perpendicular to the major surface of the substrate (i.e., in the z-direction of FIG. 2) to connect the ends of the gates 423 of the bit line select transistors 401 to one of the second plurality of gate connection lines 431. Thus, in embodiments, a driver circuit located outside of the field of view of FIG. 2 may selectively energize the respective gates 415, 423 of the word line and bit line select transistors 405, 401 using the respective the gate connection lines 429, 431 and conductive vias 433, 435.

An insulating material (not shown for clarity in FIG. 2) may be located over the word line select transistors 405 in the word line connection region 407. A plurality of conductive vias 437 may extend through the insulating material in a direction substantially perpendicular to the major surface 412 of the substrate (i.e., the z-direction) as shown in FIG. 4. Each of the conductive vias 437 may connect the source region 411 of a word line select transistor 405 to a word line contact region located above the word line select transistors 405, as described further below.

Figure 3:
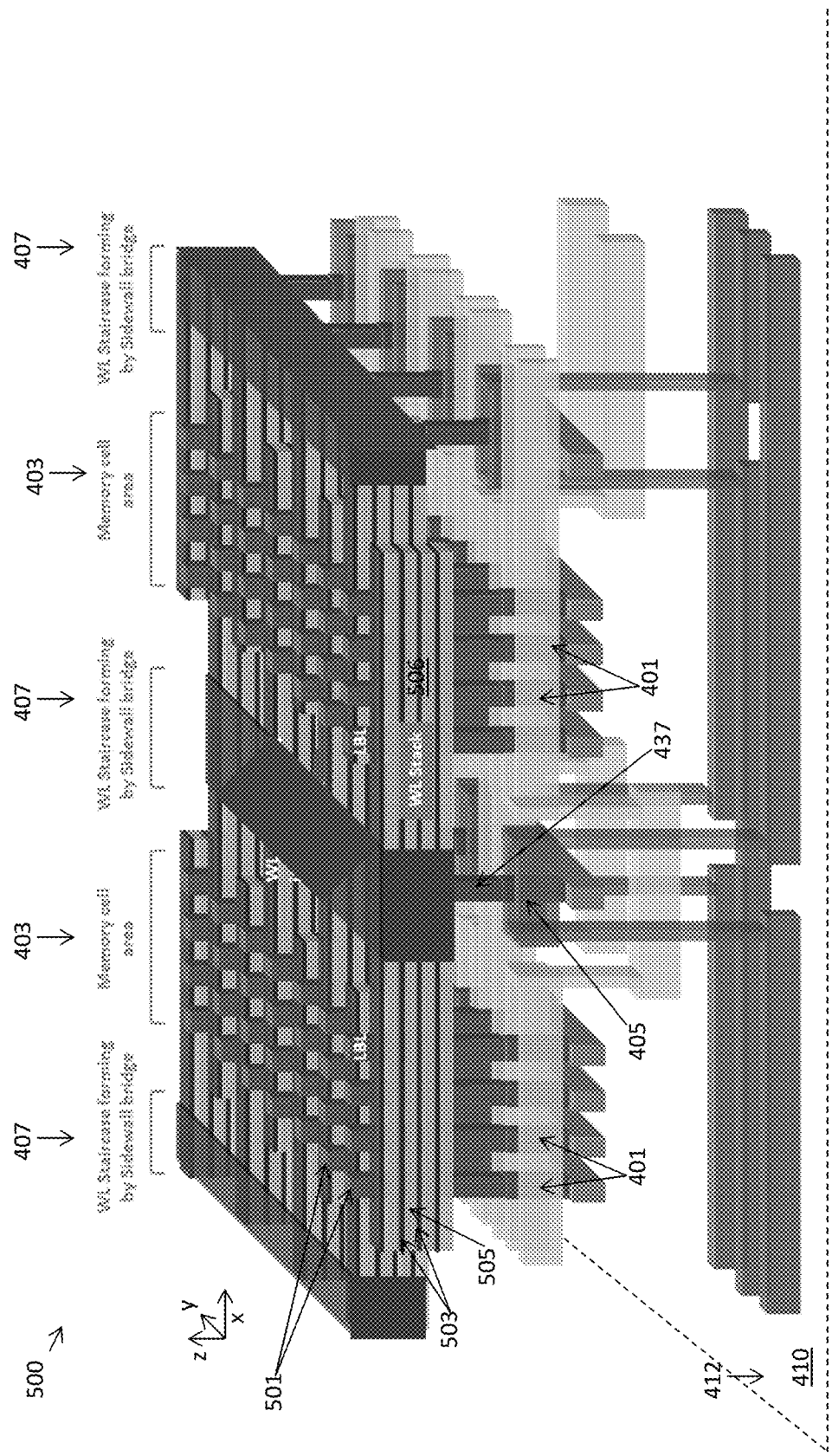
FIG. 3 shows a perspective view of a memory cell array and word line contact regions formed above the word line select transistors and the bit line select transistors in the device of FIG. 2.

FIG. 3 is perspective view of a memory device 500 schematically illustrating memory cell arrays formed in the device regions 403 above the bit line select transistors 401 and contact regions formed in word line connection regions 407 above the word line select transistors 405. In this embodiment, the monolithic three-dimensional memory device 500 comprises a ReRAM device that includes a plurality of vertically-extending conductive bit lines 501. Each of the bit lines 501 (also referred to as local bit lines (LBLs)) may be electrically connected to a source region 419 (see FIG. 2) of an underlying bit line select transistor 401. A plurality of word lines 503 elongated in the x-direction and spaced apart in the y-direction extend adjacent to two opposing side surfaces of the bit lines 501. The word lines 503 may form a word line stack 506 comprising alternating layers of the electrically conductive word lines 503 and an insulating material 505 that separates the word lines 503 in the vertical (i.e., z-axis) direction. A non-volatile memory element material such as described above with reference to FIG. 1 may extend over the side surfaces of the bit lines 501 facing the word lines 503, and a memory cell (memory storage element) may be located at each intersection of a word line 503 and a bit line 501. Thus, each of the memory cell arrays in a device region 403 includes a plurality of columns of vertically oriented memory cells (i.e., spaced along the z-axis direction in FIG. 3).

In other embodiments, the three-dimensional monolithic memory device may comprise a vertical NAND device and the three-dimensional memory array may comprise a plurality of vertical NAND stings in the device regions 403, wherein each NAND string may comprise a column of vertically oriented memory cells. The electrically conductive word lines 503 may comprise or may be electrically connected to control gate electrodes of the vertical NAND memory strings. Exemplary embodiments of a vertical NAND memory string are described below with reference to FIGS. 6A-6B and 7A-7B.

The word line connection regions 407 may also include a stack of an alternating plurality of electrically conductive layers (i.e., word line connection layers) and electrically insulating layers which may be continuous with the word lines 503 and insulating layers 505 of the word line stack 506 extending in the adjacent device regions 403. This is shown more clearly in FIGS. 4A-4D. The stack may be connected to the source regions 411 (see FIG. 2) of the word line select transistors 405 by the conductive vias 437. In addition, as described in further detail below in connection with FIGS. 4A-4D, the word line connection regions 407 may comprise a staircase configuration such that the source region 411 (see FIG. 2) of each word line select transistor 405 is connected to a plurality of sets of one or more word lines 503, wherein each set of one or more word lines extends in a different level of the device (i.e., in the z-axis direction). Thus, each source region 411 of a word line select transistor 405 connects to a word line 503 extending adjacent to only one memory cell in a respective column of the plurality of columns of vertically oriented memory cells in the device region 403. Conversely, for a given column of vertically oriented memory cells, each word line 503 extending adjacent to a respective memory cell may be connected to a different word line select transistor 405 in the word line connection region(s) 407.

Figure 4A:
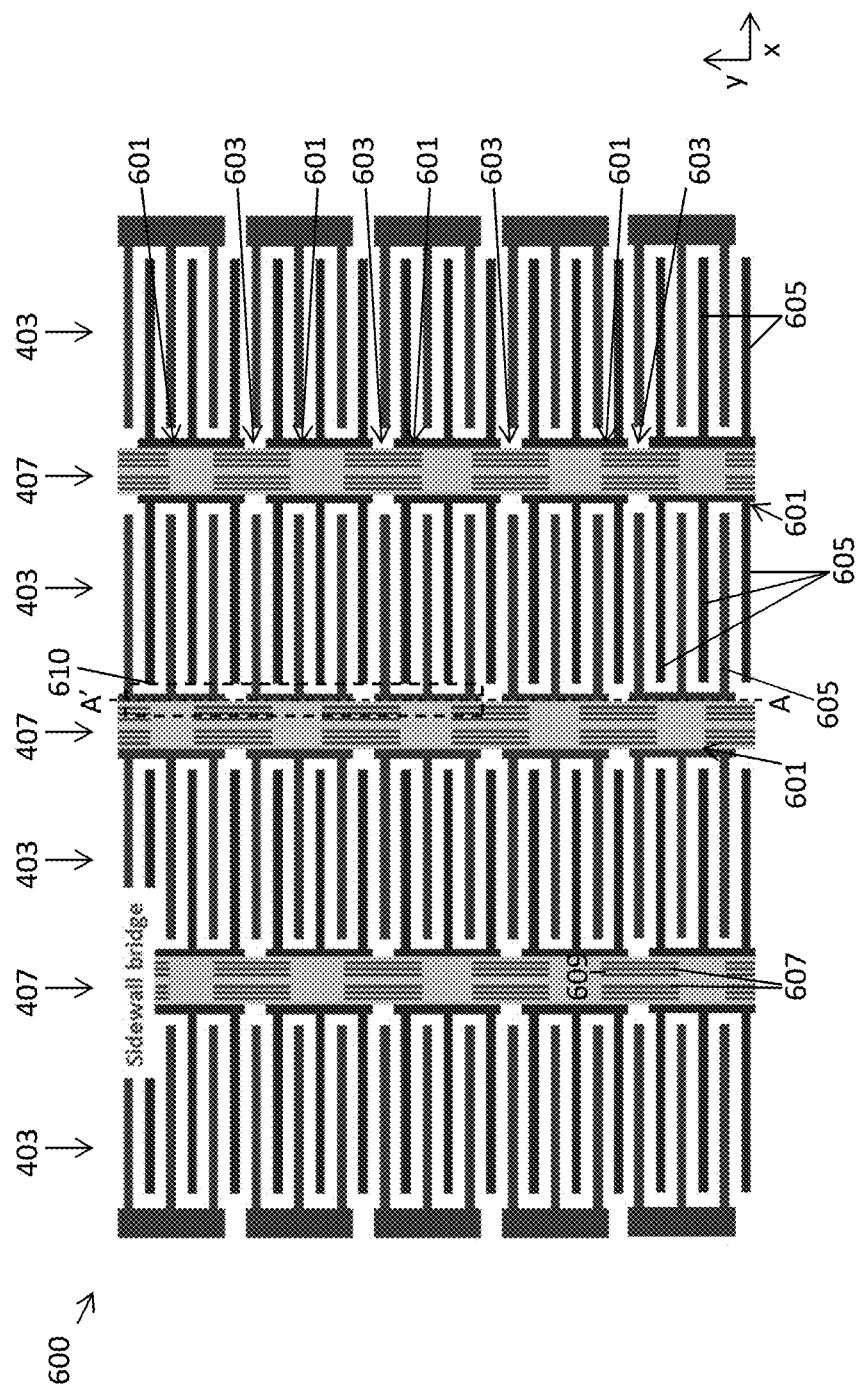
FIG. 4A is a top view of a three-dimensional monolithic memory device according to an embodiment.

FIG. 4A is a top view of a three-dimensional monolithic memory device 600 according to one embodiment. The device 600 is substantially identical to the devices of FIGS. 2 and 3, and includes a plurality of device regions 403 and word line connection regions 407 between the device regions 403. As shown in FIG. 4A, each of the word line connection regions 407 comprises a plurality of contact regions 601 that may be separated from one another by an insulating material 603. Each contact region 601 may comprise a stack of an alternating plurality of electrically conductive layers (i.e., word line connection layers) and electrically insulating layers. The stacks in the contact regions 601 may be continuous with the word line stack 506 (see FIG. 3) extending in the adjacent device regions 403. As shown in FIG. 6A, each contact region 601 is continuous with a plurality of elongated projections 605 of the word line stack 506 that extend from the respective contact regions 601 into the adjacent device region 403. In the embodiment of FIG. 4A, three projections 605 extend from each contact region 601 in the x-axis direction into the device region 403 located adjacent to a first side (i.e., the left side in FIG. 4A) of the contact region 601 and three projections 605 extend from the same contact region 601 in the x-axis direction into the device region 403 located adjacent to a second side of the contact region 601 opposite the first side (i.e., the right side in FIG. 4A).

As shown in FIG. 4A, the projections 605 may have a staggered configuration within the device regions 403 such that each projection 605 extending in a first direction along the x-axis from a first contact region 601 on a first side of the device region 403 may be located between a pair of projections 605 extending in the opposite direction along the x-axis from one or more contact regions 601 located on a second side of the device region 403 opposite the first side of the device region 403 to form two interdigitated word line comb structures. A plurality of vertically-extending conductive bit lines having a non-volatile memory element material formed over surfaces of the bit lines (not shown in FIG. 4A for clarity) may be located in the device regions 403 between adjacent projections 605.

Figure 4B:
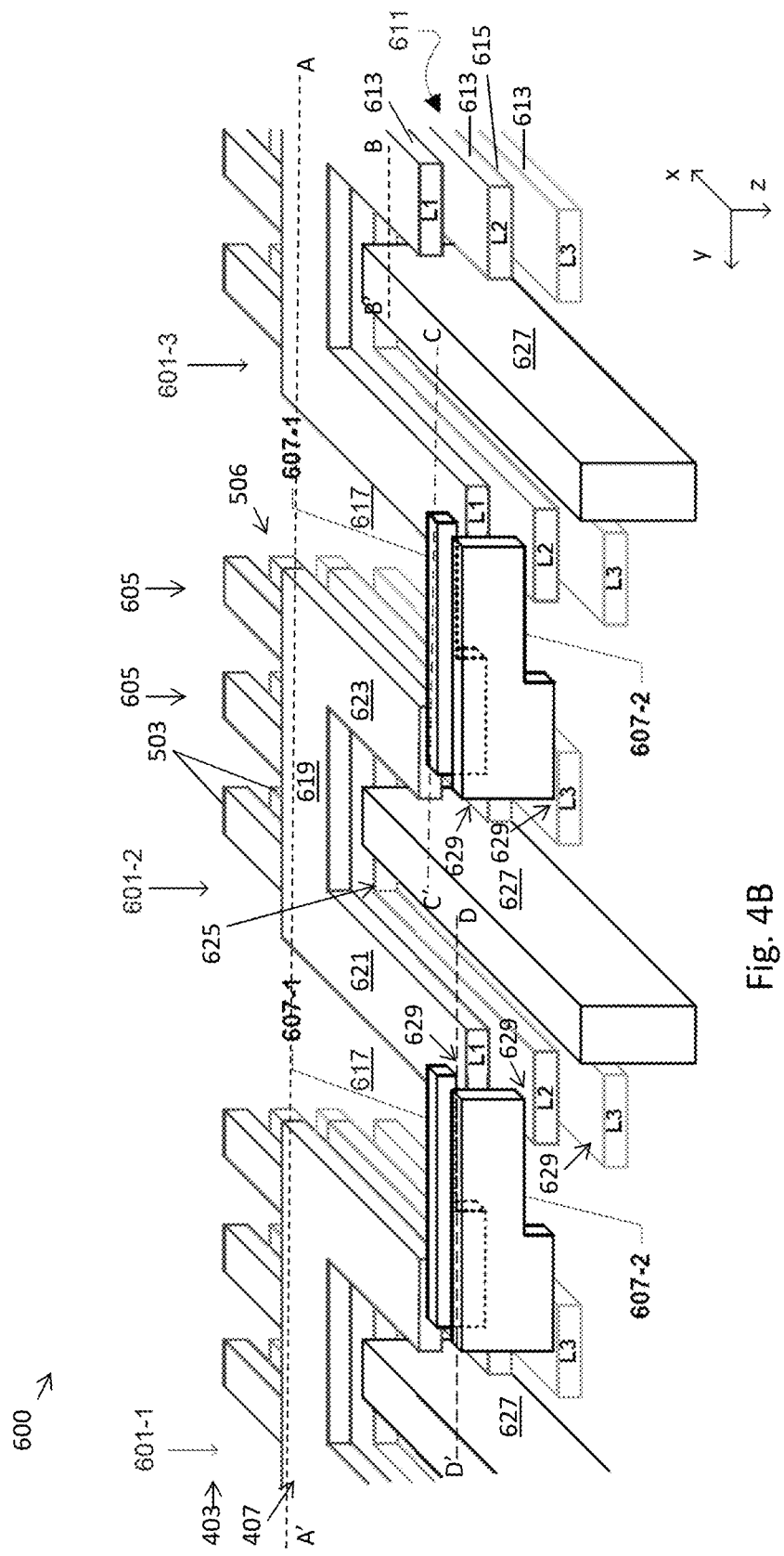
FIG. 4B is a partial cross-section perspective view of a portion of the device of FIG. 4A illustrating a word line connection region.

FIG. 4A also shows a plurality of bridge connectors 607 extending between the adjacent contact regions 601 in the word line connection regions 407. The bridge connectors 607 may comprise an electrically conductive material. Adjacent bridge connectors 607 may be separated by sidewall spacers 609 comprising an electrically insulating material. The bridge connectors 607 are more clearly illustrated in FIG. 4B, which is a partial cross-section perspective view of a portion of the device 600 substantially corresponding to the dashed region 610 in FIG. 4A. FIG. 4B shows one side of three adjacent contact regions 601-1, 601-2, 601-3 in the word line connection region 407 and a portion of the projections 605 of the word line stack 506 extending into a first device region 403. The opposing side of each of the contact regions 601-1, 601-2, 601-3 extend into a second device region opposite the first device region and may have the same configuration as shown in FIG. 4B.

Figure 4C:
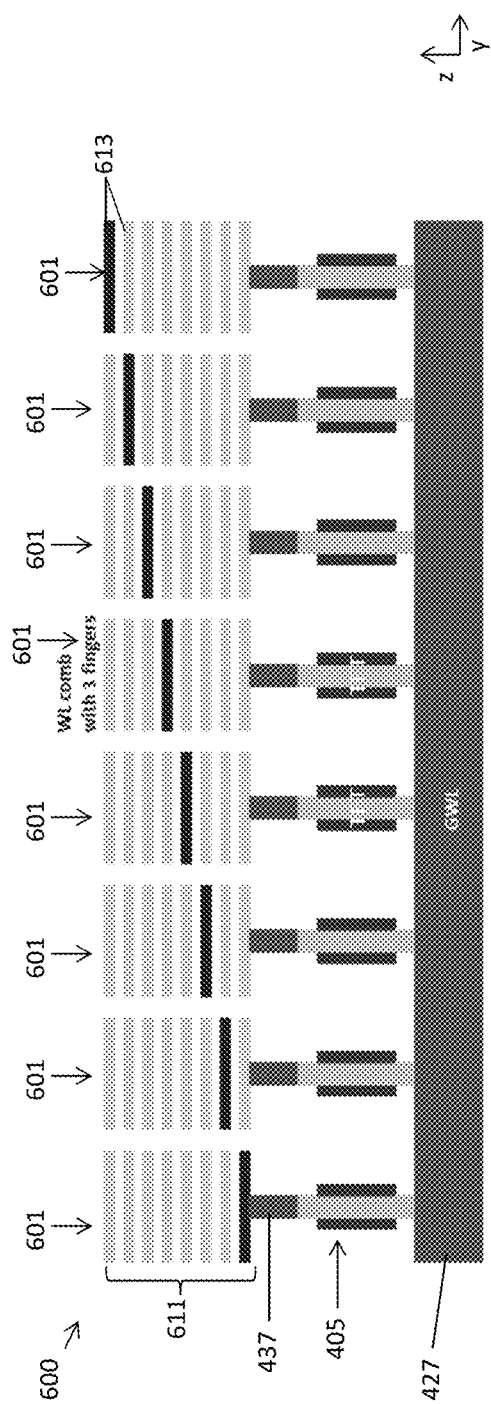
FIG. 4C is a side cross-section view of the device taken along lines A-A' in FIGS. 4A and 4B.

FIG. 4B shows each of the contact regions 601-1, 601-2, 601-3 comprises a stack 611 of an alternating plurality of electrically conductive word line contact layers 613 and electrically insulating layers between the word line contact layers 613. (The insulating layers may be located in the spaces 615 between the respective contact layers 613 and are not illustrated in FIG. 4B for clarity). Each of the contact regions 601-1, 601-2, 601-3 may be separated from one another by a gap 617, which may also be filled with an insulating material. Each of the word line contact layers 613 of the stack 611 may extend in a different level above the substrate (i.e., a contact level), and may be continuous with one or more word lines 503 also extending in the same level above the substrate. FIG. 4B shows three levels of word line contact layers 613 and word lines 503—a first level (L1), a second level (L2) below the first level, and a third level (L3) below the second level. The stacks 611 may include any number of contact levels, such as between 2-100 levels (e.g., 8-64 levels, including 16 or 32 levels). FIG. 4C shows a cross section of the device 600 in the y-z plane taken along line A-A' in FIGS. 4A and 4B that illustrates eight contact regions 601, each comprising a stack 611 of eight word line contact layers 613 located in different contact levels (i.e., L1-L8). Also shown in FIG. 4C is a common drain contact line/global word line (GWL) 427 and eight word line select transistors 405 located below each of the contact regions 601 and connected to the bottom word line contact layer 613 of each stack 611 by a conductive via 437, as described above with reference to FIG. 3.

As shown in FIG. 4B, the side of the stack 611 facing away from the adjacent device region 403 may have a shape similar to the English letter "U," with a connector portion 619 extending in the y-axis direction adjacent to the word line projections 605 and two side portions 621, 623 extending in the x-axis direction substantially perpendicular to the connector portion 619. Interior of the connector portion 619 and side portions 621, 623 may be a trench 625 extending through at least a portion of the contact layers 613 and containing an insulating material 627. In embodiments, the insulating material 627 may completely fill the trench 625. The opposite side of the stack 611 contains the word line fingers/projections 503/605 extending from connector portions 616 in the word line connection region 407 into the adjacent device region 403.

The word line contact layers 613 of each stack 611 may form a stepped pattern in each of the contact regions 601-1, 601-2, 601-3 such that each conductive word line contact layer 613 includes at least one contact portion 629 that extends beyond at least one overlying layer of the stack. As shown in contact region 601-2 in FIG. 4B, for example, a first contact layer 613 in contact level L1 includes a contact portion 629 in the first side portion 621 of the stack 611 that extends beyond (i.e., further in the y-axis direction than) an overlying layer, which may be an insulating cover layer (not shown in FIG. 4B) located over the stack 611. A second contact layer 613 in contact level L2 includes a first contact portion 629 in the first side portion 621 of the stack 611 that extends beyond the contact portion 629 in the overlying first contact layer 613 in contact level L1. The second contact layer 613 in contact level L2 also includes a second contact portion 629 in the second side portion 623 of the stack 611 that extends beyond the overlying first contact layer 613 in contact level L1. A third contact layer 613 in contact level L3 includes a first contact portion 629 in the first side portion 621 of the stack 611 that extends beyond the first contact portion 629 in the overlying second contact layer 613 in contact level L2, and also includes a second contact portion 629 in the second side portion 623 of the stack 611 that extends beyond the second contact portion 629 in the overlying second contact layer 613 in contact level L2. It is noted that for the contact layers 613 having two contact portions 629 on the respective side portions 221, 223 of the stack 611, the contact portions 629 may be staggered, such that the first contact portion 629 on the first side portion 221 of the stack may extend further in the y-axis direction (i.e., out of the page in FIG. 4B) than the second contact portion 629 on the second side portion 223 of the stack 611 and located at the same contact level, L. The stepped configuration as shown in FIG. 4B may continue through all of the layers of the stack 611.

FIG. 4B also illustrates bridge connectors 607 extending between the contact regions 601-1, 601-2, 601-3. Each bridge connector 607 extends between a first electrically conductive word line contact layer 613 in a first contact region and a second electrically conductive word line contact layer 613 in a second contact region, where the first and second electrically conductive word line contact layers 613 are located in different contact levels. A plurality of bridge connectors 607 may extend between each of the adjacent contact regions 601-1, 601-2, 601-3 as shown in FIG. 4B, wherein each bridge connector 607 may connect electrically conductive word line contact layers 613 extending in different contact levels, L.

As shown in FIG. 4B, a first set of bridge connectors 607-1 may connect word line contact layers 613 extending in contact level L1 in each contact region 601 to word line contact layers 613 extending in contact level L2 in an adjacent contact region 601. A second set of bridge connectors 607-2 may connect word line contact layers 613 extending in contact level L2 in each contact region 601 to word line contact layers 613 extending in contact level L3 in an adjacent contact region 601. A third set of bridge connectors (not shown in FIG. 4B) may connect word line contact layers 613 extending in contact level L3 in each contact region 601 to word line contact layers 613 extending in a lower contact level (e.g., L4) in the adjacent contact region 601. This may continue such that all of the word line contact layers 613 of the stack 611 are connected by a bridge connector 607 to at least one other word line contact layer 613 extending in a different contact level in an adjacent contact region 601.

As shown in FIG. 4B, each bridge connector 607 may comprise an electrically conductive material (e.g., a metal) and may extend in the vertical x-z plane. The adjacent bridge connectors 607 may be spaced apart in the y-direction, and sidewall spacers 609 (see FIG. 4A) comprising an insulating material may be located between the bridge connectors 607. The bridge connectors 607 may contact each of the word line contact layers 613 at the respective contact portions 629 of the word line contact layers 613.

The bridge connectors 607 extending between the plurality of contact regions 601-1, 601-2, 601-3 may provide a "staircase" configuration such that a first plurality of bridge connectors 607 extending between a first contact region and a second contact region (e.g., contact regions 601-1 and 601-2 in FIG. 4B) connect word line contact layers 613 at relatively lower contact levels in the first contact region 601-1 to word line contact layers 613 at relatively higher contact levels in the second contact region 601-2. A second plurality of bridge connectors 607 extending between the second contact region and a third contact region (e.g., contact regions 601-2 and 601-3 in FIG. 4B) connect word line contact layers 613 at relatively lower contact levels in the second contact region 601-2 to world line contact layers 613 at relatively higher contact levels in the third contact region 601-3. Additional bridge connectors 607 may connect each of the additional contact regions 601 in the word line connection region 407 in a similar manner.

Figure 4D:
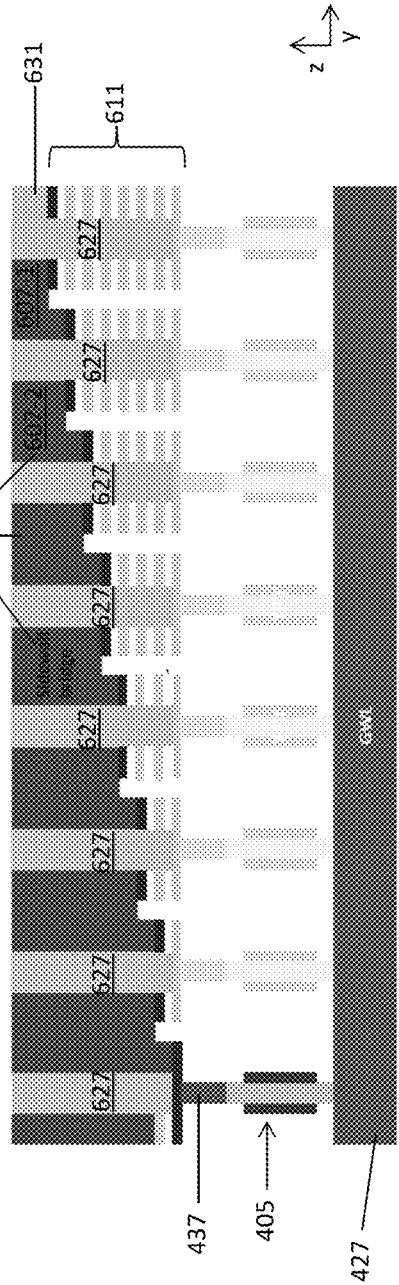
FIG. 4D is a side composite cross-section view of the device taken along lines B-B', C-C' and D-D' in FIG. 4B.

FIG. 4D is a composite cross-section illustration of the device 600 illustrating a plurality of word line contact layers 613 in different contact regions 601 connected in a "staircase" configuration by bridge connectors 607. The composite view of FIG. 4D is taken through different planes of the device 600 in the x- and z-directions and spaced apart in the y-direction and extending through a plurality of bridge connectors 607 connecting the different contact levels of the various contact regions 601. In particular, from right to left the composite cross-section of FIG. 4D is taken along line B-B' in FIG. 4B (i.e., through contact region 601-3 and a cover layer 631 of insulating material), along line C-C' in FIG. 4B (i.e., through a first bridge connector 607-1 connecting contact level L1 of contact region 601-3 and contact level L2 of contact region 601-2), along line D-D' in FIG. 4B (i.e., through a second bridge connector 607-2 connecting contact level L2 of contact region 601-2 and contact level L3 of contact region 601-1), and then along a series of lines (i.e., lines E-E', F-F', G-G', H-H' and I-I') outside the field of view of FIG. 4B, each extending through a bridge connector 607 located in a different x-z plane and connecting the contact levels of the respective contact regions 601 to a relatively lower contact level in the adjacent contact region 601. The word line contact layer 613 in the lowest contact level (i.e., contact level L8) is electrically coupled to a word line select transistor 405, as shown on the bottom left of FIG. 4D. The word line select transistor 405 is coupled to each of the highlighted word line contact layers 613 in FIGS. 4C and 4D by the plurality of bridge connectors 607 arranged in the "staircase" configuration shown in FIGS. 4B and 4D. Thus, the word line select transistor 405 of FIG. 4D may select (i.e., energize) a plurality of word line contact layers 613 extending in different contact levels in the respective contact regions 601. Additional word line select transistors may select different word line contact layers 613 in each of the contact regions 601.

Various embodiments relate to a method of making a three-dimensional monolithic memory device. Referring to FIGS. 5A-5B, an in-process multilevel device 700 may include at least one device region 403 and a word line connection region 407 including a plurality of contact regions 601 adjacent to the at least one device region 403.

The device 700 may be similar to the devices described above with reference to FIGS. 2-4D. Each of the contact regions 601 may comprise a stack 611 of an alternating plurality of electrically conductive word line contact layers 613 and electrically insulating layers 614. The stacks 611 may be separated from one another by an insulating material 617. An insulating cover layer 618 may be located over the stacks 611. The electrically conductive word line contact layers 613 may comprise a suitable conductive material, such as a metal or metal nitride (e.g., TiN). The insulating material 614, 617, 618 may comprise a suitable electrically insulating material, such as an oxide material (e.g., silicon oxide). The stacks 611 may be continuous with word line stacks 506 that extend as projections 605 from the contact regions 601 in the word line connection region 407 into the device regions 403, as described above. The stacks 611, 506 may be formed as a continuous stack of the alternating plurality of electrically conductive layers 613 and insulating layers 614 over the substrate 410 (shown in FIG. 2), and portions of the continuous stack may be removed (e.g., etched through a patterned mask) to define the plurality of contact regions 601 in the word line connection region(s) 407 and the interdigitated projections 605 within the device region(s) 403. The insulating material 617 may extend between the projections 605 of the word line stacks 506. FIG. 5A is a top view of the device 700, and FIG. 5B is a side cross-section view of the device 700 taken along line J-J' of FIG. 5A.

As shown in FIG. 5B, a pair of conductive vias 437 may connect to the bottom of each stack 611 in the contact regions 601. Each via 437 may electrically connect the stack 611 to a word line select transistor located beneath the stack 611, as described above. In this embodiment, multiple vias 437 beneath each stack 611 enables multiple word line drivers (e.g., TFT word line select transistors) to be used for each contact region 601. As a result, a more uniform driving current may be provided. Alternatively or in addition, the multiple via configuration 437 may provide redundancy (i.e., backup) in case one of the vias 437 or underlying word line select transistors fails. Alternatively, there may be a single via 437 and TFT per stack 611.

A first mask layer 701 (e.g., photoresist and/or a hard mask layer) may be provided over the device 700 as shown in FIGS. 5C and 5D. The mask layer 701 may be patterned using suitable techniques (e.g., photolithography and etching) to expose a first portion 702 of the word line connection region 407 while second portions 704 of the word line connection region 407 and the device region 403 remain covered by the mask 701 as shown in FIGS. 5E and 5F. The device 700 may then be etched through the patterned mask 701 to remove the insulating cover layer 618 and expose a first word line contact layer 613 in a first contact level (i.e., WL 16) of the stacks 611, as shown in FIGS. 5E and 5F. FIG. 5E is a top view of the device 700 showing the word line contact layer 613 in contact level WL 16 exposed. FIG. 5F is a side cross section view of the device 700 taken along line K-K in FIG. 5E. (The mask layer 701 and insulating cover layer 618 are located behind the cut line K-K' in FIG. 5F and are shown in phantom).

Figure 5G:
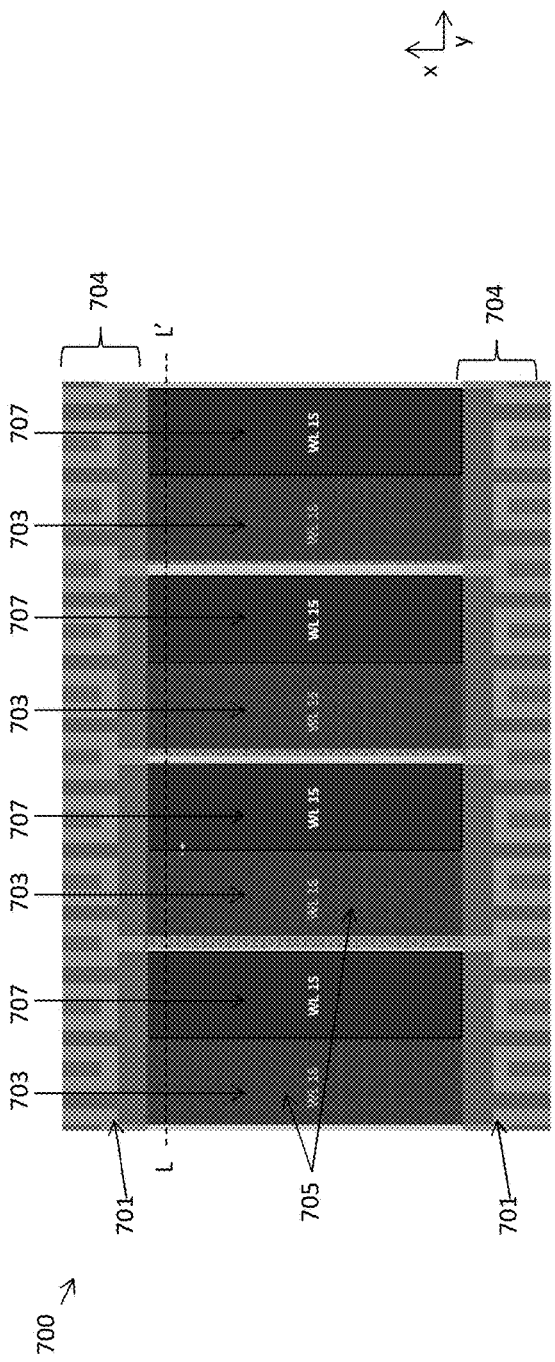
FIGS. 5A-5T are top views (FIGS. 5A, 5C, 5E, 5G, 5I, 5K, 5M, 5O, 5Q, 5S) and side cross sectional views (FIGS. 5B, 5D, 5F, 5H, 5J, 5L, 5N, 5P, 5R, 5T) of a method of fabricating a three-dimensional monolithic memory device having a word line connection region according to an embodiment.
Figure 5H:
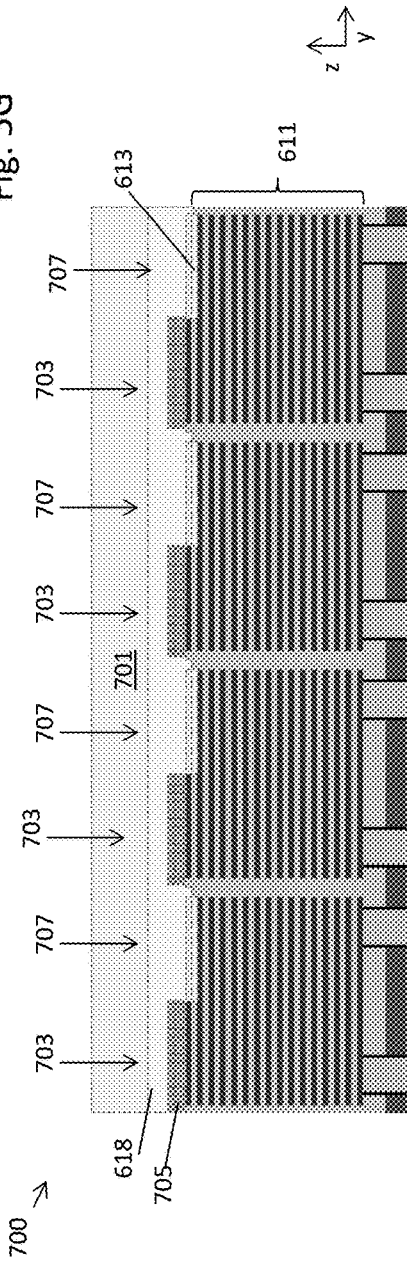

Referring to FIGS. 5G and 5H, first side portions 703 (e.g., the left side portions) of each of the exposed word line contact layers 613 in contact level WL 16 of the stacks 611 may be covered by a mask layer 705 (e.g., photoresist and/or a hard mask layer which may be deposited and patterned using any suitable techniques) while the second side portions 707 (e.g., right side portions) of the stacks 611 may be exposed. The device 700 may then be etched through masks 701 and 705 to expose a second word line contact layer 613 in a second contact level (i.e., WL 15) in each of the second side portions 707 of the stacks 611, as shown in FIGS. 5G and 5H. The mask layer 705 may then be removed. FIG. 5G is a top view of the device 700 showing the word line contact layer 613 in contact level WL 15 exposed on the second side portions 707 of the stacks 611. FIG. 5H is a cross section view of the device taken along L-L' in FIG. 5G. (The mask layer 701, the insulating cover layer 618 and the uppermost word line contact layer 613 (i.e., contact level L16) and insulating layer 614 on the second side portions 707 of the stacks 611 are located behind the cut line L-L' in FIG. 5G and are shown in phantom).

Referring to FIGS. 5I and 5J, first sidewall spacers 609 (e.g., 609-1) comprising an insulating material may be formed along opposite sides 706A, 706B in the x-direction of the exposed first portion 702 of the word line connection region 407. The first sidewall spacers 609 may be formed by depositing an insulating material (e.g., silicon oxide or silicon nitride) over the exposed word line contact layers 613 in contact levels WL 16 and WL 15 and performing a sidewall spacer anisotropic etch to form sidewall spacers 609 of insulating material extending from the exposed word line contact layers 613 in a generally vertical direction (i.e., along the z-axis, substantially perpendicular to the major surface of the support substrate). FIG. 5I is a top view of the device 700 showing the sidewall spacers 609, and FIG. 5J is a cross-section view of the device taken along line M-M' in FIG. 5I.

Figure 5K:
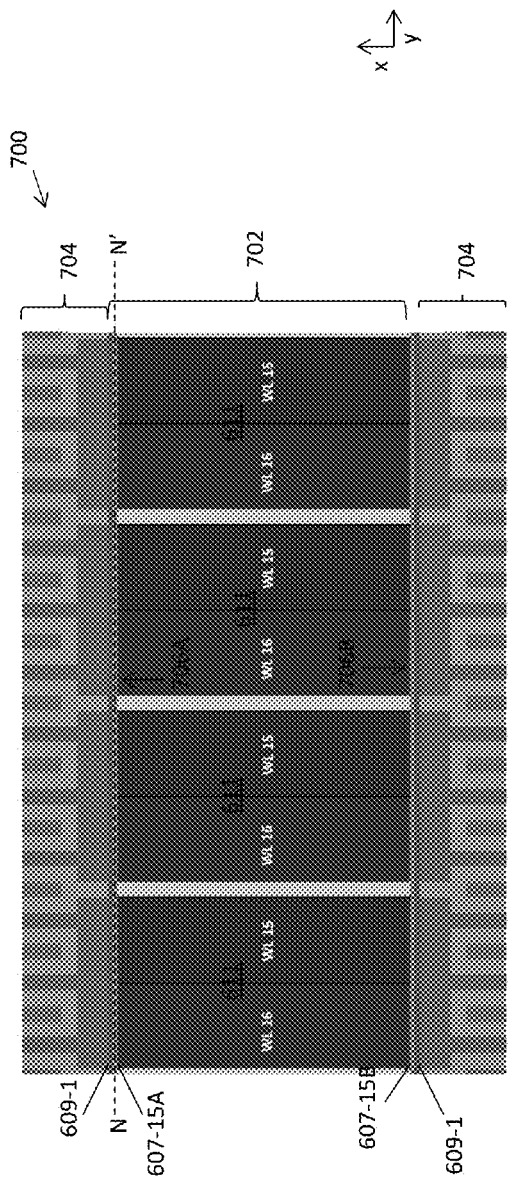
Figure 5L:
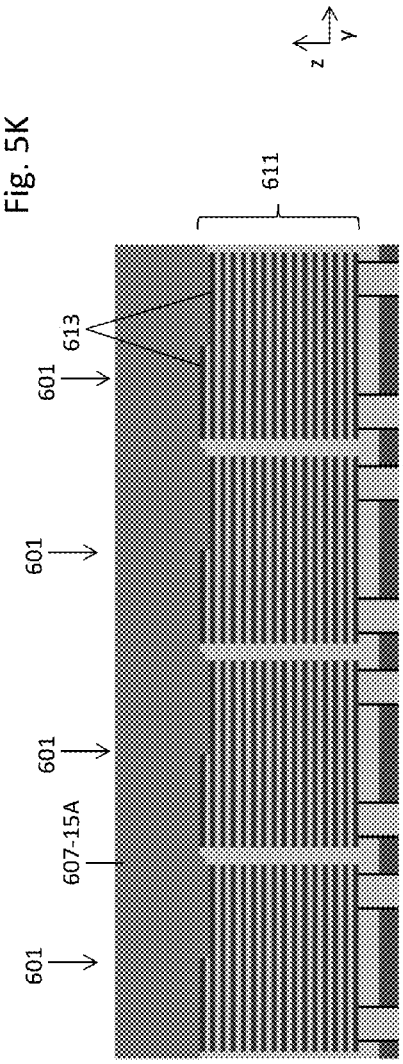

Referring to FIGS. 5K and 5L, first bridge connectors 607 (e.g., 607-15A, 607-15B) comprising an electrically conductive material (e.g., a metal or metal nitride) are formed along opposite sides 706A, 706B of the exposed first portions 702 of the word line connection region 407, and adjacent to the sidewall spacers 609. The bridge connectors 607 may extend over multiple contact regions 601 within a word line connection region 407, and may contact the exposed word line contact layers 613 in contact levels WL 16 and WL15 on in the respective first and second side portions 703, 707 of each word line contact region. The bridge connectors 607 may extend in a generally vertical direction (i.e., along the z-axis, substantially perpendicular to the major surface of the support substrate) from the word line contact layers 613. FIG. 5K is a top view of the device 700 showing the bridge connectors 607 adjacent to the sidewall spacers 609, and FIG. 5L is a cross-section view of the device taken along line N-N' in FIG. 5K.

Figure 5M:
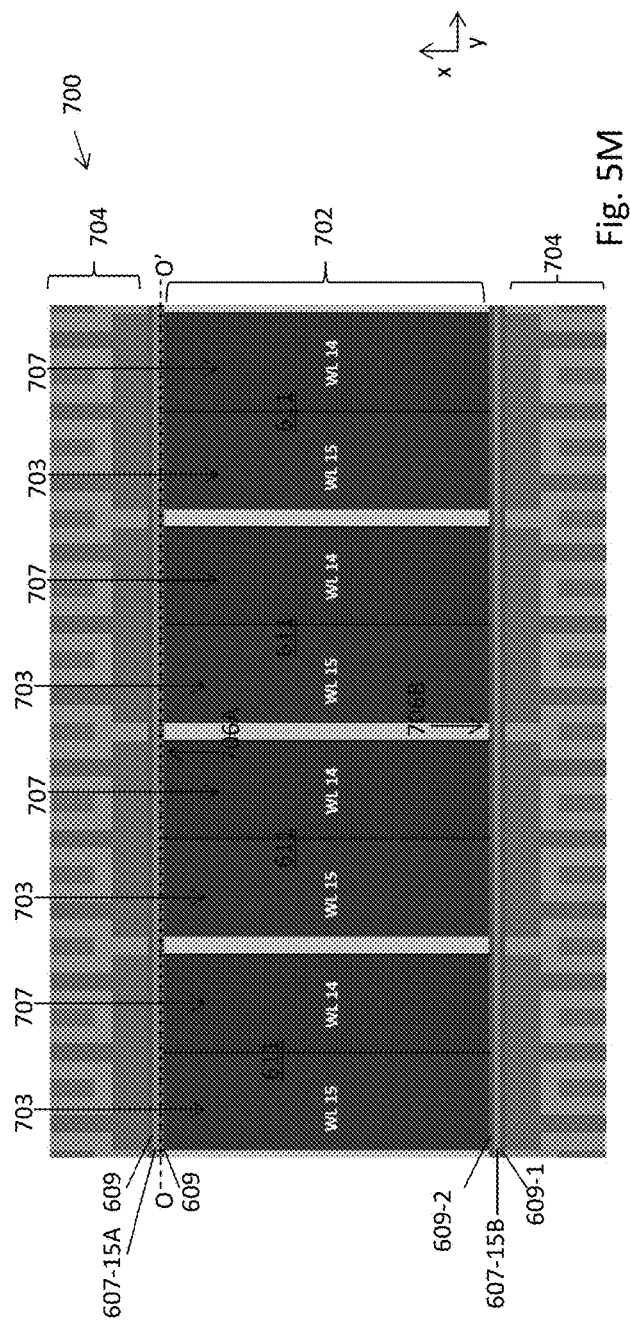
Figure 5N:
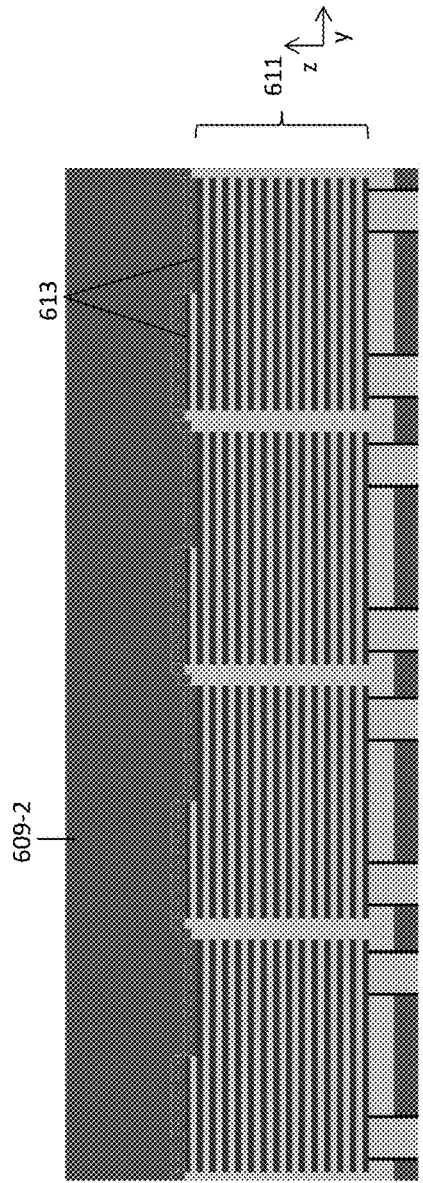

Referring to FIGS. 5M and 5N, exposed first portions 702 of the word line connection region 407 may be etched to expose the second word line contact layer 613 in the second contact level (i.e., WL 15) in each of the first (e.g., left) side portions 703 of the stacks 611 and to expose a third word line contact layer 613 in a third contact level (i.e., WL 14) in each of the second (e.g., right) side portions 707 of the stacks 611. The etching preferably does not remove the bridge connectors 607 and sidewall spacers 609, which may optionally be protected by a mask during the etching. FIG. 5M is a top view of the device 700 showing the exposed word line contact layers 613 in the second and third contact levels (i.e., WL 15 and WL 14), and FIG. 5N is a side cross section view of the device taken along line O-O' in FIG. 5M.

Referring again to FIGS. 5M and 5N, second sidewall spacers 609 (e.g., 609-2) comprising an insulating material may be formed along opposite sides 706A, 706B of the exposed first portions 702 of the word line connection region 407 and adjacent to the first bridge connectors 607-15. The second sidewall spacers 609 may be formed by depositing an insulating material (e.g., silicon oxide or silicon nitride) over the exposed word line contact layers 613 in contact levels WL 15 and WL 14 and performing a sidewall spacer anisotropic etch to form second sidewall spacers 609-2 of insulating material extending from the exposed word line contact layers 613 in a generally vertical direction (i.e., along the z-axis, substantially perpendicular to the major surface of the support substrate). FIG. 5M is a top view of the device 700 showing the second sidewall spacers 609 adjacent to the first bridge connectors 607, and FIG. 5N is a cross-section view of the device taken along line O-O' in FIG. 5M.

Figure 5O:
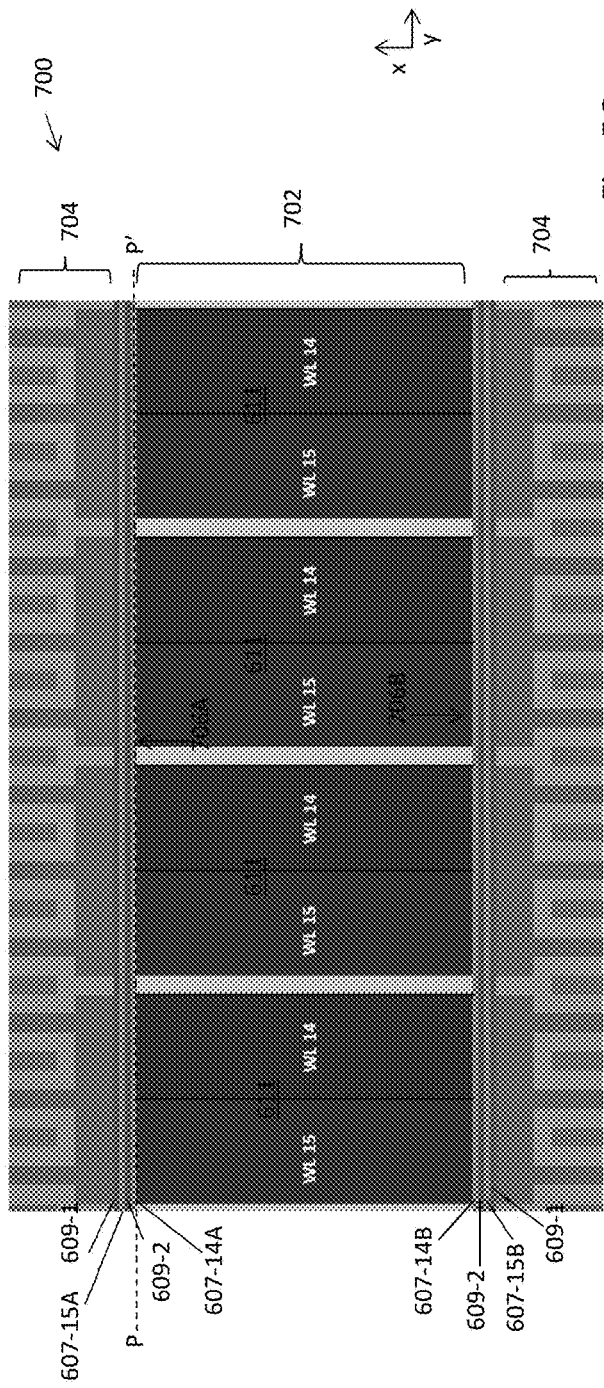
Figure 5P:
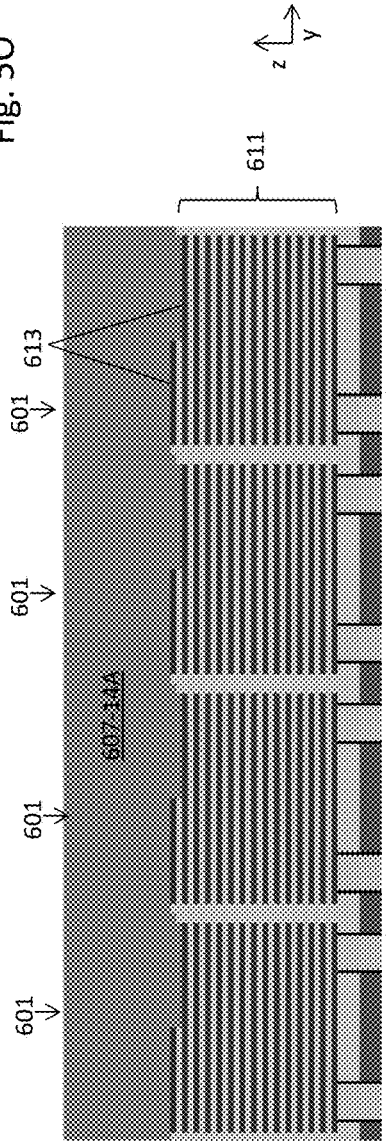

Referring to FIGS. 5O and 5P, second bridge connectors 607 (e.g., 607-14A, 607-14B) comprising an electrically conductive material (e.g., a metal or metal nitride) are formed along the opposite sides 706A, 706B of the exposed first portions 702 of the word line connection region 407, and adjacent to the second sidewall spacers 609-2. The second bridge connectors 607-14A, 607-14B may extend over multiple contact regions 601 within a word line connection region 407, and may contact the exposed word line contact layers 613 in contact levels WL 15 and WL14 on in the respective first and second side portions 703, 707 of each contact region. The second bridge connectors 607-14A, 607-14B may extend in a generally vertical direction (i.e., along the z-axis, substantially perpendicular to the major surface of the support substrate). FIG. 5O is a top view of the device 700 showing the second bridge connectors 607-14A, 607-14B adjacent to the second sidewall spacers 609-2, and FIG. 5P is a cross-section view of the device taken along line P-P' in FIG. 5O.

Figure 5Q:
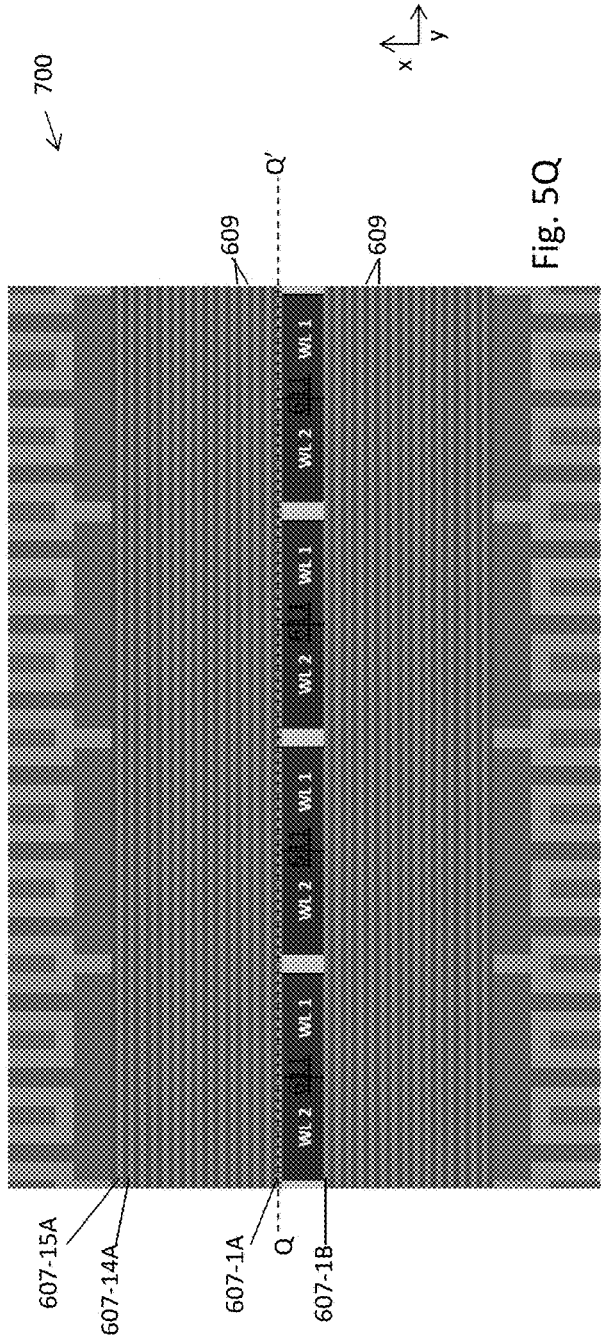
Figure 5R:
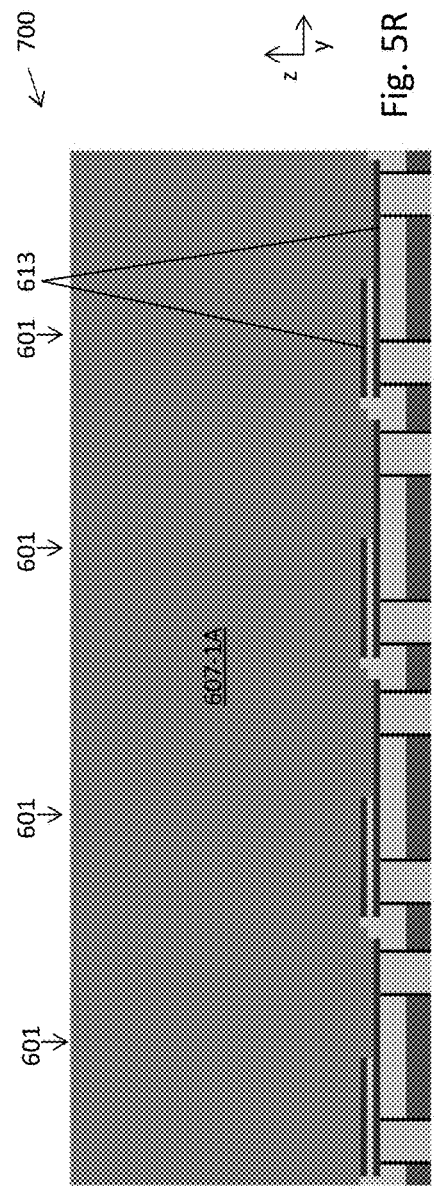

The steps shown in FIGS. 5M-5P may be repeated to sequentially etch the exposed first portions 702 of the stacks 611 in the word line connection region 407 and expose each of the underlying word line contact layers 613 in the first (e.g., left) and second (e.g., right) side portions 703, 707 of the stacks 611, form additional sidewall spacers 609 over the exposed word line contact layers 613 and form additional bridge connectors 607 over the exposed word line contact layers 613 adjacent to the sidewall spacers 609, until the word line contact layers 613 in the bottom two contact levels (i.e., WL2 and WL1) are exposed as shown in FIG. 5Q. Each of the bridge connectors 607 in FIG. 5Q contacts the exposed word line contact layers 613 in different contact levels in the respective first and second side portions 703, 707 of the contact regions 601. FIG. 5R is a side cross section view of the device taken along line R-R' in FIG. 5Q that shows a bridge connector 607-1A contacting the word line contact layers 613 in contact levels WL2 and WL 1.

Figure 5S:
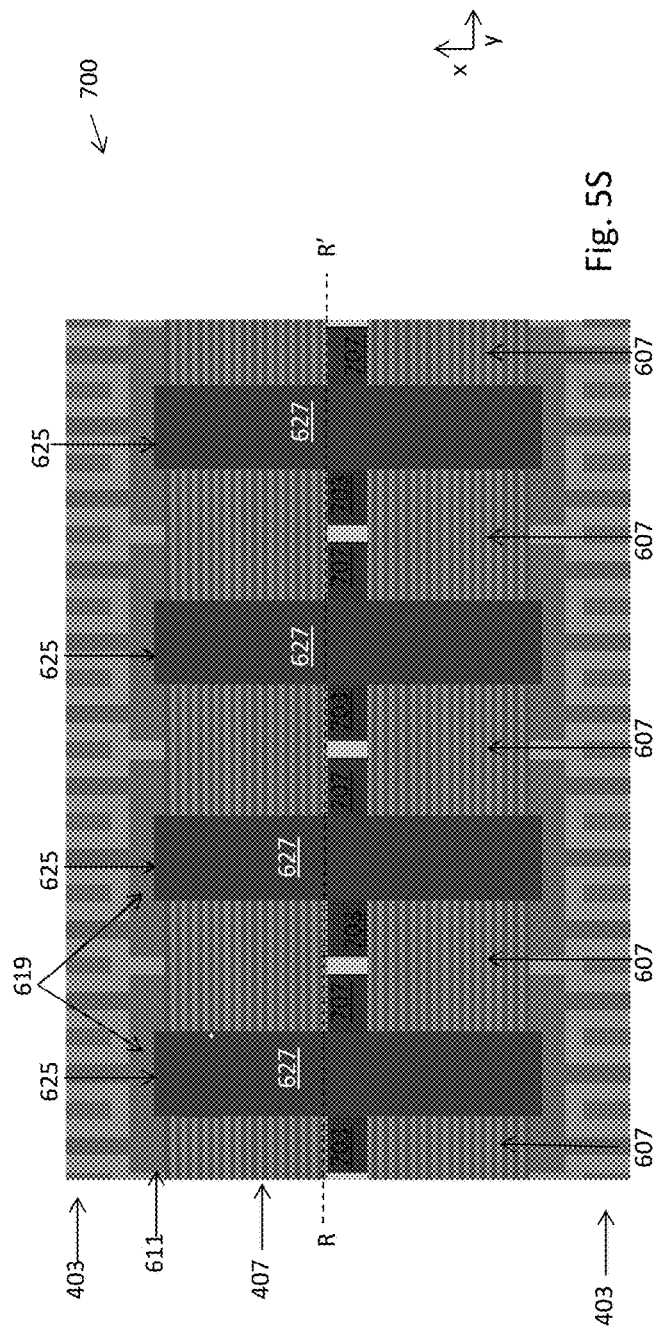
Figure 5T:
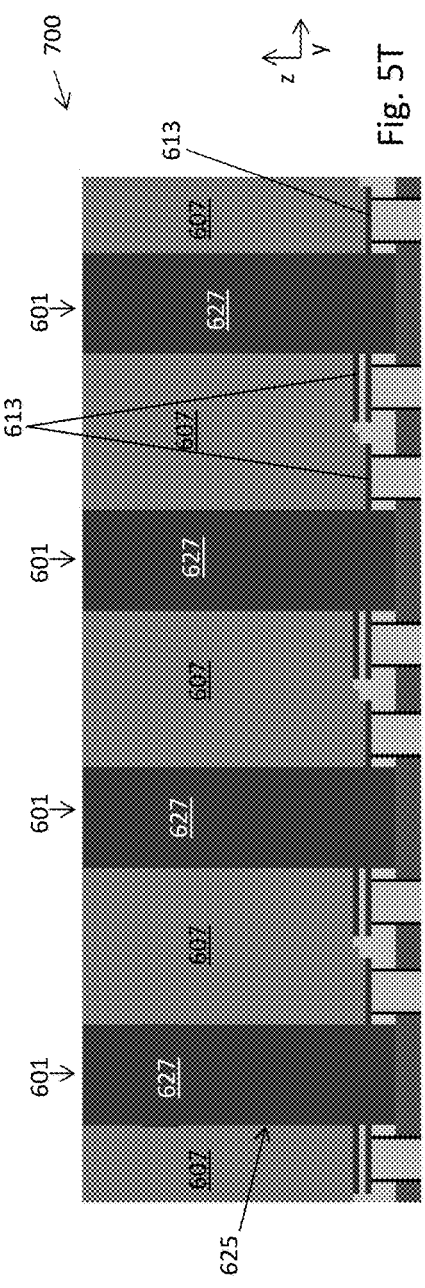

Referring to FIGS. 5S and 5T, trenches 709 may be formed extending through the plurality of bridge connectors 607 and word line contact layers 613 of each stack 611 (e.g., via etching through a patterned mask, not shown in FIGS. 5S and 5T), and the trenches 625 may filled with an electrically insulating material 627 to separate first sets of bridge connectors 607 extending from the first side portions 703 of each contact region 601 to the second side portions 707 of the adjacent contact region 601 from second sets of bridge connectors 607 extending from the second side portions 707 of each contact region 601 to the first side portions 703 of the adjacent contact region 601. The trenches 625 filled with insulating material 627 may also define substantially "U"-shaped portions (see 619, 621 and 623 in FIG. 4B) of the stacks 611 extending around the insulating material 627 at the respective ends of the stacks 611 facing the device regions 403, as described above with reference to FIG. 4B. The sets of bridge connectors 607 (e.g., 607-1 to 607-15) may provide a staircase configuration such that the bridge connectors connect relatively lower contact level word line contact layers 613 in a first contact region 601-1 to relatively higher contact level word line contact layers 613 in a second contact region 601-2, and connect the word line contact layers 613 in the second contact region 601-2 to relatively higher contact level word line contact layers 613 in a third contact region 601-3, etc. FIG. 5S is a top view of the device 700 showing the trenches 625 filled with insulating material 627 extending through the stacks 611 and bridge connectors 607, and FIG. 5T is a cross-section view of the device taken along line R-R' in FIG. 5S.

Referring to FIGS. 6A-7B, in some embodiments, the three-dimensional monolithic memory device may comprise a vertical NAND device and the three-dimensional memory array may comprise a plurality of vertical NAND stings in the device regions 403, wherein each NAND string may comprise a column of vertically oriented memory cells. The electrically conductive word lines 503 may comprise or may be electrically connected to control gate electrodes of the vertical NAND memory strings. A monolithic three-dimensional NAND string 1180 may comprise a semiconductor channel 1 having at least one end portion extending substantially perpendicular to a major surface 1100a of a base layer 1100, as shown in FIGS. 6A and 7A. For example, the semiconductor channel 1 may have a pillar shape and the entire pillar-shaped semiconductor channel in the NAND memory cell area extends substantially perpendicularly to the major surface 1100a of the base layer 1100, as shown in FIGS. 6A and 7A. In these embodiments, the source/drain electrodes of the device can include an upper electrode 1202 (e.g., drain electrode or contact line) formed over the semiconductor channel 1, as shown in FIGS. 6A and 7A. A drain-side select transistor at the top of the channel is not shown for clarity. An optional body contact electrode 1102 may be disposed in the base layer 1100 to provide body contact to the connecting portion of the semiconductor channel 1 from below.

The NAND string's 1180 source-side select gate or access transistors may be located below the vertical column of memory cells. In some embodiments, the lower (i.e., source-side) select gate or access transistors may be configured as shown in U.S. patent application Ser. No. 14/133,979, filed on Dec. 19, 2013, which is incorporated by reference herein. A word line connection area 407 such as described and illustrated above with reference to FIGS. 2-5S, may be located in a peripheral area of an array of NAND strings 1180 and may include word line drivers (e.g., TFTs) coupled to the word lines of the NAND string array via a staircase configuration as described above.

Alternatively, the NAND string's 1180 source side-select gate or access transistor may be a vertically-oriented field effect transistor 200, e.g., of the type described with reference to FIGS. 2 and 3 above. The top portion of the channel 208 of the transistor may be in electrical contact with the semiconductor channel 1 of the NAND sting's memory cell portion. At least one gate 202 may be formed below the NAND string 1180, e.g., in the base layer 1100. A gate insulator layer 210 may be located between the gate(s) 208 and the channels 1, 202. The gate(s) 208 may comprise or be in electrical contact with a select electrode of the NAND string 1180, e.g., a conductive rail (not shown) extending in the direction into and out of the page in FIGS. 6A and 7A.

In some embodiments, the base layer 1100 may include a source or drain contact line 316 made of a conductive material (e.g., a metal, metal silicide, or metal nitride)

formed below the doped source or drain region 204. The contact 316 may be formed on a substrate 300.

As will be apparent to one skilled in the art in view of the present disclosure, in some embodiments an array of NAND strings 1180 may be formed monolithically above the array of transistors 401 in the device region 403 as shown in FIGS. 2 and 3, with each transistor 401 functioning as a select gate or access transistor for a respective NAND string 1180. A word line connection region 407 may be formed monolithically above a separate array of word line select transistors 405, which may be adjacent to the array of transistors 401 in the device region 403 as shown in FIGS. 2 and 3.

In some embodiments, the semiconductor channel 1 may be a filled feature, as shown in FIGS. 7A-7B. In some other embodiments, the semiconductor channel 1 may be hollow, for example a hollow cylinder filled with an insulating fill material 2, as shown in FIGS. 6A-6B. In these embodiments, and an insulating fill material 2 may be formed to fill the hollow part surrounded by the semiconductor channel 1.

The base layer 1100 can include, e.g., any semiconducting substrate 300 known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The base layer 1100 may include integrated circuits fabricated thereon, such as the select transistors 200 (e.g., as shown in FIGS. 6A and 7A) and/or driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 6A-7B. The control gate electrodes 3 may comprise a portion having a strip shape extending substantially parallel to the major surface 1100a of the base layer 1100. The plurality of control gate electrodes 3 comprise at least a first control gate electrode 3a located in a first device level (e.g., device level A) and a second control gate electrode 3b located in a second device level (e.g., device level B) located over the major surface of the base layer below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof. For example, in some embodiments, polysilicon is preferred to allow easy processing.

A blocking dielectric 7 is located adjacent to and may be surrounded by the control gate(s) 3. The blocking dielectric 7 may comprise a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIGS. 6A-7B. Alternatively, the blocking dielectric 7 may be continuous (not shown).

The monolithic three dimensional NAND string may also comprise a plurality of discrete charge storage segments 9, each of which is located between the blocking dielectric segments 7 and the channel 1. Similarly, the plurality of discrete charge storage segments 9 comprise at least a first discrete charge storage segment 9a located in the device level A and a second discrete charge storage segment 9b located in the device level B. Alternatively, the charge storage segment(s) 9 may be continuous (not shown). That is, the charge storage segments may comprise localized regions in a continuous charge storage layer.

The tunnel dielectric 11 of the monolithic three dimensional NAND string is located between each one of the plurality of the discrete charge storage segments 9 and the semiconductor channel 1. The tunnel dielectric 11 may comprise a plurality of blocking dielectric segments 11 or a continuous layer of dielectric material.

The blocking dielectric 7 and the tunnel dielectric 11 may be independently selected from any one or more same or different electrically insulating materials, such as silicon oxide, silicon nitride, silicon oxynitride, or other high-k insulating materials.

The charge storage segment(s) 9 may comprise a discrete or continuous conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate, conductive nanoparticles, or a discrete or continuous charge storage dielectric (e.g., silicon nitride or another dielectric) feature. For example, in some embodiments, the discrete charge storage segments 9 are discrete charge storage dielectric features, each of which comprises a nitride feature located in the respective clam-shaped blocking dielectric segment 7, where the silicon oxide blocking dielectric segment 7, the nitride feature 9 and the silicon oxide tunnel dielectric 11 form oxide-nitride-oxide discrete charge storage structures of the NAND string. Alternatively, a polysilicon floating gate may be used.

In various embodiments, the NAND device may include any of the features described in U.S. Pat. No. 8,187,936 issued on May 29, 2013, U.S. patent application Ser. No. 14/133,979 filed Dec. 19, 2013, and U.S. patent application Ser. No. 14/136,103 filed Dec. 20, 2013, all of which are incorporated herein by reference in their entirety.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A three-dimensional monolithic memory device, comprising:
   at least one device region and a plurality of contact regions each comprising a stack of an alternating plurality of electrically conductive word line contact layers and electrically insulating layers located over a substrate, wherein the stacks in the plurality of contact regions are separated from one another by an insulating material; and a bridge connector comprising an electrically conductive material extending between a first electrically conductive word line contact layer of a first stack in a first contact region and a second electrically conductive word line contact layer of a second stack in a second contact region, wherein the first electrically conductive word line contact layer extends in a first contact level substantially parallel to a major surface of the substrate and the second electrically conductive word line contact layer extends in a second contact level substantially parallel to the major surface of the substrate that is different than the first level.

2. The device of claim 1, wherein the device comprises a plurality of bridge connectors each extending between a respective one of the electrically conductive word line contact layers of the first stack in the first contact region and a respective one of the electrically conductive word line contact layers of the second stack in the second contact region, wherein each bridge connector connects electrically conductive layers extending in different contact levels over the major surface of the substrate.

3. The device of claim 2, wherein the plurality of electrically conductive word line contact layers form a stepped pattern in each of the contact regions such that each conductive word line contact layer includes at least one contact portion that extends beyond at least one overlying layer of the stack and one of the plurality of bridge connectors connects to the contact portion.

4. The device of claim 3, wherein each bridge connector extends in a plane substantially perpendicular to the major surface of the substrate and adjacent bridge connectors are separated by sidewall spacers comprising an electrically insulating material.

5. The device of claim 2, wherein the plurality of bridge connectors comprise a first plurality of bridge connectors extending between a first contact region and a second contact region, and the device further comprises:

a third contact region located on an opposite side of the second contact region than the first contact region; and a second plurality of bridge connectors extending between a respective one of the electrically conductive word line contact layers of the second stack in the second contact region and a respective one of a plurality of electrically conductive word line contact layers in a third stack of the third contact region, wherein each bridge connector of the second plurality of bridge connectors connects electrically conductive word line contact layers extending in different contact levels over the major surface of the substrate.

6. The device of claim 5, wherein the first plurality of bridge connectors is separated from the second plurality of bridge connectors by an insulating material that extends through portions of the plurality of electrically conductive word line contact layers of the second stack in the second contact region.

7. The device of claim 5, wherein the first plurality of bridge connectors and the second plurality of bridge connectors provide a staircase configuration such that the first plurality of bridge connectors connect relatively lower contact level electrically conductive word line contact layers in the first contact region to relatively higher contact level electrically conductive word line contact layers in the second contact region, and the second plurality of bridge connectors connect relatively lower contact level electrically conductive word line contact layers in the second contact region to relatively higher contact level electrically conductive word line contact layers in the third contact region.

8. The device of claim 7, wherein each of the electrically conductive word line contact layers of the contact regions is continuous with at least one electrically conductive word line extending within the device region at the same level as the respective electrically conductive word line contact layer, wherein each word line extends adjacent to a plurality of memory cells in a three-dimensional memory array located in the device region.

9. The device of claim 8, wherein each contact region is continuous with a plurality of elongated projections that extend from a contact region into the device region in a direction substantially parallel to the major surface of the substrate, wherein each elongated projection comprises at least a portion of a multi-level stack of the electrically conductive word lines and the projections are separated from each other by an insulating material.

10. The device of claim 9, wherein each contact region is located over at least one word line select transistor having a first end in electrical contact with a first electrically conductive word line contact layer of the respective contact region.

11. The device of claim 10, wherein a word line select transistor is configured to select a first set of one or more word lines that are continuous with the first electrically conductive word line contact layer of a first contact region located over the word line select transistor and to select additional sets of one or more word lines that are each continuous with one or more word line contact layers of one or more additional contact regions that are electrically connected to the first electrically conductive word line contact layer of the first contact region via one or more bridge connectors, wherein the first set of word lines and the additional sets of word lines each extend in different contact levels over the major surface of the substrate.

12. The device of claim 10, wherein the word line select transistor comprises a field effect transistor comprising:

an elongated drain contact line comprising an electrically conductive material extending substantially parallel to the major surface of the substrate;

a drain comprising a first conductivity type semiconductor region overlying the drain contact line;

a source comprising the first conductivity type semiconductor region located above the drain;

a channel comprising a second conductivity type semiconductor region different from the first conductivity type and extending substantially perpendicular to the major surface of the substrate between the drain and the source; and a gate comprising an electrically conductive material located adjacent to the channel and separated from the channel by a gate insulating material.

13. The device of claim 12, wherein the elongated drain contact line extends below a plurality of contact regions and is electrically connected to a second end comprising the drain of each of the word line select transistors, wherein the source of each of the word line select transistors is electrically connected to the first electrically conductive word line contact layer of each of the respective contact regions.

14. The device of claim 13, further comprising a via filled with an electrically conductive material that extends in a direction substantially perpendicular to the major surface of the substrate between the first electrically conductive word line contact layer of the first contact region and the source of the word line select transistor.

15. The device of claim 14, wherein the device region comprises a second plurality of bit line select transistors that are located below the plurality of memory cells in the three-dimensional memory array, and the second plurality of bit line select transistors are located in a same level of the device as the word line select transistors.

16. The device of claim 14, wherein the plurality of contact regions extend along a first direction substantially parallel to the major surface of the substrate between first and second adjacent device regions.

17. The device of claim 14, wherein the three-dimensional monolithic memory device comprises a ReRAM device and the device region comprises a plurality of electrically conductive bit lines extending perpendicular to the major surface of the substrate and a non-volatile memory element material extends over a side surface the bit line and adjacent to each of the plurality of word lines.

18. The device of claim 14, wherein the three-dimensional monolithic memory device comprises a vertical NAND device and the device region comprises a plurality of NAND memory strings extending perpendicular to the major surface of the substrate and each of the plurality of word lines in the device region comprises or is electrically connected to a control gate electrode of a NAND memory string.

19. A three-dimensional monolithic memory device, comprising:
   a plurality of word line select transistors;
   a word line connection area located above the plurality of word line select transistors;
   a second plurality of select transistors located in a same level of the device as the word line select transistors; and
   a three-dimensional memory array comprising a plurality of memory cells located above the second plurality of select transistors,
   wherein each of the word line select transistors comprises a field effect transistor comprising:
      an elongated drain contact line comprising an electrically conductive material extending in a first direction substantially parallel to the major surface of the substrate;
      a drain comprising a first conductivity type semiconductor region overlying the drain contact line;
      a source comprising the first conductivity type semiconductor region located above the drain;
      a channel comprising a second conductivity type semiconductor region different from the first conductivity type and extending substantially perpendicular to the major surface of the substrate between the drain and the source; and
      a gate comprising an electrically conductive material located adjacent to the channel and separated from the channel by a gate insulating material.

20. The device of claim 19, wherein the plurality of word line select transistors share a common drain contact line, and a plurality of gates extend adjacent to the respective channels in a second direction substantially parallel to the major surface of the substrate and substantially perpendicular to the first direction of the drain contact line.

21. The device of claim 20, wherein each gate is connected to at least one first conductive gate connection line by a conductive via, wherein the at least one first conductive gate connection line is located at a lower level of the device than the level of the plurality of word line select transistors, and the at least one first conductive gate connection line extends below the second plurality of select transistors.

22. The device of claim 21, wherein the second plurality of select transistors comprises a second plurality of drain contact lines extending in the first direction and a plurality of elongated gates extending in the second direction substantially perpendicular to the first direction, and each elongated gate is connected to at least one second conductive gate connection line by a conductive via, wherein the at least one second conductive gate connection line extends below the plurality of word line select transistors.

23. The device of claim 22, wherein the at least one first conductive gate connection line and the at least one second conductive gate connection line are located at different levels of the device.

24. The device of claim 19, further comprising:
   an insulating layer over the plurality of word line select gate transistors; and
   a plurality of conductive vias extending through the insulating layer and connecting the source of each of the plurality of word line select gate transistors to the word line connection area.

25. The device of claim 24, wherein the word line connection area comprises a stack of an alternating plurality of electrically conductive word line connection layers and electrically insulating layers, wherein the electrically conductive word line connection layers are continuous with a plurality of word lines that extend adjacent to the plurality of memory cells in the three-dimensional memory array.

26. The device of claim 25, wherein the word line connection area comprises a staircase configuration such that the source of each word line select transistor is connected to a plurality of sets of one or more word lines, wherein each set of one or more word lines extends in a different level of the device.

27. The device of claim 26, wherein the plurality of memory cells in the three-dimensional memory array includes a plurality of columns of vertically oriented memory cells, and each source of a word line select transistor connects to a word line extending adjacent to only one memory cell in a respective column of the plurality of columns.

28. A three-dimensional monolithic memory device, comprising:
   a plurality of word line select transistors;
   a word line connection area located above the plurality of word line select transistors;
   a second plurality of select transistors located in a same level of the device as the word line select transistors; and
   a three-dimensional memory array comprising a plurality of memory cells located above the second plurality of select transistors,
   wherein the three-dimensional monolithic memory device comprises a ReRAM device and the three-dimensional memory array comprises a plurality of vertically-extending electrically conductive bit lines connected to the second plurality of select transistors and a non-volatile memory element material extends over a side surface the bit line and a plurality of word lines extend from the word line connection area adjacent to the non-volatile memory element material.

29. The device of claim 19, wherein the three-dimensional monolithic memory device comprises a vertical NAND device and the three-dimensional memory array comprises a plurality of vertical NAND memory strings, and a plurality of word lines extending from the word line connection area comprise or are connected to control gate electrodes of the vertical NAND memory strings.

30. The device of claim 28, wherein each of the word line select transistors comprises a field effect transistor comprising:
  an elongated drain contact line comprising an electrically conductive material extending in a first direction substantially parallel to the major surface of the substrate;
  a drain comprising a first conductivity type semiconductor region overlying the drain contact line;
  a source comprising the first conductivity type semiconductor region located above the drain;
  a channel comprising a second conductivity type semiconductor region different from the first conductivity type and extending substantially perpendicular to the major surface of the substrate between the drain and the source; and
  a gate comprising an electrically conductive material located adjacent to the channel and separated from the channel by a gate insulating material.

31. The device of claim 30, wherein the plurality of word line select transistors share a common drain contact line, and a plurality of gates extend adjacent to the respective channels in a second direction substantially parallel to the major surface of the substrate and substantially perpendicular to the first direction of the drain contact line.

32. The device of claim 31, wherein each gate is connected to at least one first conductive gate connection line by a conductive via, wherein the at least one first conductive gate connection line is located at a lower level of the device than the level of the plurality of word line select transistors, and the at least one first conductive gate connection line extends below the second plurality of select transistors.

33. The device of claim 32, wherein the second plurality of select transistors comprises a second plurality of drain contact lines extending in the first direction and a plurality of elongated gates extending in the second direction substantially perpendicular to the first direction, and each elongated gate is connected to at least one second conductive gate connection line by a conductive via, wherein the at least one second conductive gate connection line extends below the plurality of word line select transistors.

34. The device of claim 33, wherein the at least one first conductive gate connection line and the at least one second conductive gate connection line are located at different levels of the device.

35. The device of claim 32, further comprising:
  an insulating layer over the plurality of word line select gate transistors; and
  a plurality of conductive vias extending through the insulating layer and connecting the source of each of the plurality of word line select gate transistors to the word line connection area.

36. The device of claim 35, wherein the word line connection area comprises a stack of an alternating plurality of electrically conductive word line connection layers and electrically insulating layers, wherein the electrically conductive word line connection layers are continuous with a plurality of word lines that extend adjacent to the plurality of memory cells in the three-dimensional memory array.

37. The device of claim 36, wherein the word line connection area comprises a staircase configuration such that the source of each word line select transistor is connected to a plurality of sets of one or more word lines, wherein each set of one or more word lines extends in a different level of the device.

* * * * *